(12) United States Patent
Kim et al.

(10) Patent No.: US 10,373,985 B2
(45) Date of Patent: Aug. 6, 2019

(54) DISPLAY DEVICE USING MICRO LIGHT EMITTING DIODE

(71) Applicant: SAMSUNG DISPLAY CO., LTD., Yongin-si, Gyeonggi-do (KR)

(72) Inventors: Minsoo Kim, Yongin-si (KR); Mugyeom Kim, Yongin-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 0 days.

(21) Appl. No.: 15/485,545

(22) Filed: Apr. 12, 2017

(65) Prior Publication Data
US 2017/0294451 A1    Oct. 12, 2017

(30) Foreign Application Priority Data
Apr. 12, 2016 (KR) .................. 10-2016-0044994

(51) Int. Cl.
| | | |
|---|---|---|
| *H01L 27/14* | (2006.01) | |
| *H01L 29/04* | (2006.01) | |
| *H01L 29/15* | (2006.01) | |
| *H01L 31/036* | (2006.01) | |
| *H01L 27/12* | (2006.01) | |
| *H01L 25/16* | (2006.01) | |
| H01L 33/60 | (2010.01) | |
| H01L 25/075 | (2006.01) | |

(52) U.S. Cl.
CPC .......... *H01L 27/124* (2013.01); *H01L 25/167* (2013.01); *H01L 27/1248* (2013.01); *H01L 25/0753* (2013.01); *H01L 27/1214* (2013.01); *H01L 33/60* (2013.01)

(58) Field of Classification Search
CPC .... H01L 27/124; H01L 27/1248; H01L 33/60
See application file for complete search history.

(56) References Cited

U.S. PATENT DOCUMENTS

| | | | |
|---|---|---|---|
| 6,773,943 B2 | 8/2004 | Oohata et al. | |
| 8,222,631 B2 | 7/2012 | Lee et al. | |
| 8,860,015 B2 | 10/2014 | Kim | |
| 9,029,880 B2 | 5/2015 | Sakariya et al. | |
| 9,093,403 B2 | 7/2015 | Kim et al. | |
| 2009/0026509 A1* | 1/2009 | Hayashi | H01L 27/14603 257/292 |
| 2013/0146777 A1* | 6/2013 | Lim | G01T 1/2018 250/370.09 |

(Continued)

FOREIGN PATENT DOCUMENTS

| | | |
|---|---|---|
| KR | 100579182 B1 | 5/2006 |
| KR | 100829743 B1 | 5/2008 |

(Continued)

*Primary Examiner* — Ismail A Muse
(74) *Attorney, Agent, or Firm* — Cantor Colburn LLP

(57) ABSTRACT

A display device includes a display substrate; a thin film transistor over the display substrate; a bank layer covering the thin film transistor, where an opening is defined through the bank layer; an emission layer in the opening and including a micro p-n diode; a first electrode electrically connected between the thin film transistor and the emission layer; a second electrode over the emission layer; and a sealing layer covering the second electrode. The thin film transistor and the emission layer are adjacent to each other in a horizontal direction of the display substrate.

18 Claims, 7 Drawing Sheets

(56) References Cited

U.S. PATENT DOCUMENTS

| | | | |
|---|---|---|---|
| 2014/0159064 A1* | 6/2014 | Sakariya | H01L 25/0753 257/88 |
| 2014/0367705 A1* | 12/2014 | Bibl | H01L 33/44 257/88 |
| 2015/0034944 A1* | 2/2015 | Cho | H01L 27/1288 257/43 |
| 2015/0060841 A1 | 3/2015 | Chang et al. | |
| 2015/0060842 A1* | 3/2015 | Ke | H01L 33/02 257/40 |
| 2015/0077873 A1* | 3/2015 | Johnson | B32B 37/12 359/871 |
| 2015/0084054 A1* | 3/2015 | Fan | G02F 1/00 257/72 |
| 2015/0295006 A1* | 10/2015 | Chen | H01L 29/7869 257/43 |
| 2016/0190381 A1* | 6/2016 | Wu | H01L 27/1443 257/290 |
| 2016/0336486 A1* | 11/2016 | Lin | H01L 33/005 |
| 2016/0351457 A1* | 12/2016 | Chen | H01L 22/20 |
| 2016/0351548 A1* | 12/2016 | Chen | H01L 22/20 |
| 2016/0372514 A1* | 12/2016 | Chang | H01L 27/1259 |
| 2017/0059752 A1* | 3/2017 | Kwon | G02B 5/201 |
| 2017/0062397 A1* | 3/2017 | Park | H01L 27/1248 |
| 2017/0062674 A1* | 3/2017 | Kwon | H01L 33/58 |
| 2017/0062679 A1* | 3/2017 | Lee | G09G 1/00 |
| 2017/0064291 A1* | 3/2017 | Do | H04N 13/044 |
| 2017/0092673 A1* | 3/2017 | Miyamoto | H01L 27/14614 |
| 2017/0133550 A1* | 5/2017 | Schuele | H01L 33/0079 |
| 2017/0141178 A1* | 5/2017 | Sato | H01L 27/124 |
| 2017/0179092 A1* | 6/2017 | Sasaki | H01L 25/167 |
| 2017/0194307 A1* | 7/2017 | Liu | H01L 25/18 |
| 2017/0263178 A1* | 9/2017 | Bae | G09G 3/32 |
| 2017/0263828 A1* | 9/2017 | Mao | H01L 33/58 |
| 2017/0269749 A1* | 9/2017 | Bok | G02F 1/13338 |
| 2017/0271312 A1* | 9/2017 | Kwon | H01L 25/0753 |
| 2017/0294424 A1* | 10/2017 | Jeong | H01L 25/167 |
| 2017/0294425 A1* | 10/2017 | Kim | H01L 25/167 |
| 2017/0294480 A1* | 10/2017 | Kwon | H01L 27/1214 |
| 2017/0294565 A1* | 10/2017 | Kim | H01L 33/62 |
| 2017/0336690 A1* | 11/2017 | Lee | H01L 25/0753 |
| 2017/0338212 A1* | 11/2017 | Kuo | H01L 25/167 |
| 2017/0345801 A1* | 11/2017 | Lin | H01L 25/0753 |
| 2018/0190672 A1* | 7/2018 | Lee | H01L 25/0753 |

FOREIGN PATENT DOCUMENTS

| | | |
|---|---|---|
| KR | 100937865 B1 | 1/2010 |
| KR | 1020140146952 A | 12/2014 |

\* cited by examiner

DISPLAY DEVICE USING MICRO LIGHT EMITTING DIODE

This application claims priority to Korean Patent Application No. 10-2016-0044994, filed on Apr. 12, 2016, and all the benefits accruing therefrom under 35 U.S.C. § 119, the content of which in its entirety is herein incorporated by reference.

BACKGROUND

1. Field

One or more embodiments relate to a display device.

2. Description of the Related Art

A light-emitting diode ("LED") is a semiconductor device including a P-N junction diode. When a voltage is applied to the P-N diode of the LED in a forward direction, electrons recombine with holes in the P-N diode and energy generated by such a recombination is converted into light energy.

LEDs may be used for mobile apparatuses, such as smart phones, lap-top computers, digital cameras, camcorders, personal digital assistants ("PDA" s), tablet personal computers and watches, and electronic apparatuses such as desk-top computers, televisions, outdoor billboards, display devices for exhibition, dashboards for automobile, and head up displays ("HUD" s).

SUMMARY

One or more embodiments are directed to a display device including an emission layer having a micro P-N diode, and thus, having high emission efficiency.

According to one or more embodiments, a display device includes: a display substrate; a thin film transistor over the display substrate, the thin film transistor including a semiconductor active layer, a gate electrode, a source electrode, and a drain electrode; a bank layer covering the thin film transistor, where an opening is defined through the bank layer; an emission layer in the opening and including a micro p-n diode; a first electrode electrically connected between the thin film transistor and the emission layer; a second electrode over the emission layer; and a sealing layer covering the second electrode, where the thin film transistor and the emission layer are adjacent to each other in a horizontal direction of the display substrate.

In an embodiment, the display device may further include a mirror layer over the bank layer, where the mirror layer is arranged to overlap the thin film transistor in a vertical direction of the display substrate.

In an embodiment, the mirror layer may include a reflective material.

In an embodiment, the source electrode or the drain electrode may extend below the emission layer, the first electrode may be between the emission layer and an extension portion extending from the source electrode or the drain electrode, the mirror layer may be separated from the first electrode and may be over the bank layer, a color filter layer of a color corresponding to a sub-pixel may be around the emission layer, and the second electrode may be over the color filter layer and may be electrically connected to the emission layer.

In an embodiment, the mirror layer may be defined by a portion extending from the first electrode.

In an embodiment, the first electrode may cover an edge of the source electrode or the drain electrode exposed via the opening and extend over an upper surface of the bank layer to overlap the thin film transistor, the mirror layer may be defined by to an extension portion of the first electrode extending over the upper surface of the bank layer, an insulating layer burying the emission layer may extend over the bank layer, the second electrode may be over the insulating layer and be electrically connected to the emission layer, and an opening may be defined through the second electrode in a portion overlapping the mirror layer in the vertical direction of the display substrate.

In an embodiment, The first electrode may cover an edge of the source electrode or the drain electrode exposed via the opening and extend over an upper surface of the bank layer to overlap the thin film transistor in the vertical direction of the display substrate, the mirror layer may be defined by an extension portion of the first electrode extending over the upper surface of the bank layer, an insulating layer burying the emission layer may extend over the bank layer, and the second electrode may be over the insulating layer, be electrically connected to the emission layer, and have a stacked structure including the mirror layer and the insulating layer disposed between the mirror layer and the second electrode.

In an embodiment, the display device may further include a lateral reflective layer which reflects light irradiated to a lateral surface of the emission layer and is over a lateral surface of the emission layer.

In an embodiment, a portion of the source electrode or the drain electrode may extend below the emission layer, an extension portion of the source electrode or the drain electrode may have a ring shape, and a portion of the insulating layer around the emission layer may have a trench shape.

In an embodiment, the first electrode may cover an edge of the source electrode or the drain electrode exposed via the opening and extend over an upper surface of the bank layer to overlap the thin film transistor in the vertical direction of the display substrate, the mirror layer may be defined by an extension portion of the first electrode extending over the upper surface of the bank layer, an insulating layer burying the emission layer may be over the bank layer, an opening is defined through the insulating layer in a portion overlapping the mirror layer in the vertical direction of the display substrate, the second electrode may be over the insulating layer, be electrically connected to the emission layer, and expose the mirror layer when viewed in the vertical direction of the display substrate.

In an embodiment, a portion of the source electrode or the drain electrode may extend below the emission layer, and an extension portion of the source electrode or the drain electrode may be arranged in a zigzag pattern.

In an embodiment, one of the semiconductor active layer, the gate electrode, the source electrode and the drain electrode of the thin film transistor may extend below the emission layer, the first electrode may be defined by an extension portion of the one of the semiconductor active layer, the gate electrode, the source electrode and the drain electrode extending below the emission layer.

In an embodiment, the insulating layer burying the emission layer may extend over the bank layer, the mirror layer may be separated from the first electrode and be over the bank layer, the second electrode may be over the insulating layer and be electrically connected to the emission layer, and the display device may further include a lateral reflective layer which reflects light irradiated to a lateral surface of the emission layer and is over a lateral surface of the emission layer.

In an embodiment, the second electrode may be over the bank layer and be electrically connected to the emission layer, the mirror layer may be separated from the first electrode and be over the second electrode, and the display device may further include a lateral reflective layer which reflects light irradiated to a lateral surface of the emission layer and over a lateral surface of the emission layer.

In an embodiment, an extension portion of the one of the semiconductor active layer, the gate electrode, the source electrode, and the drain electrode may be arranged in a zigzag pattern.

In an embodiment, the display device may further include a conductive layer, which is below the emission layer and connected to one of the semiconductor active layer, the gate electrode, the source electrode and the drain electrode of the thin film transistor, where the first electrode may be between the emission layer and the conductive layer, and the second electrode may be electrically connected to the emission layer.

In an embodiment, the conductive layer may be in a same layer in which the one of the semiconductor active layer, the gate electrode, the source electrode and the drain electrode is arranged, and the conductive layer may be electrically connected to an extension portion of the one of the semiconductor active layer, the gate electrode, the source electrode and the drain electrode.

In an embodiment, the conductive layer may be defined by an extension portion of the one of the semiconductor active layer, the gate electrode, the source electrode, and the drain electrode.

In an embodiment, the extension portion of the one of the semiconductor active layer, the gate electrode, the source electrode and the drain electrode may be arranged in a zigzag pattern.

In an embodiment, the first electrode may cover an edge of the source electrode or the drain electrode which is exposed via the opening, the first electrode may include a transparent electrode extending below the emission layer, and the second electrode may be electrically connected to the emission layer and include a reflective electrode which reflects light in a direction to the display substrate.

BRIEF DESCRIPTION OF THE DRAWINGS

These and/or other aspects will become apparent and more readily appreciated from the following description of the embodiments, taken in conjunction with the accompanying drawings, in which.

DETAILED DESCRIPTION

Figure 1:
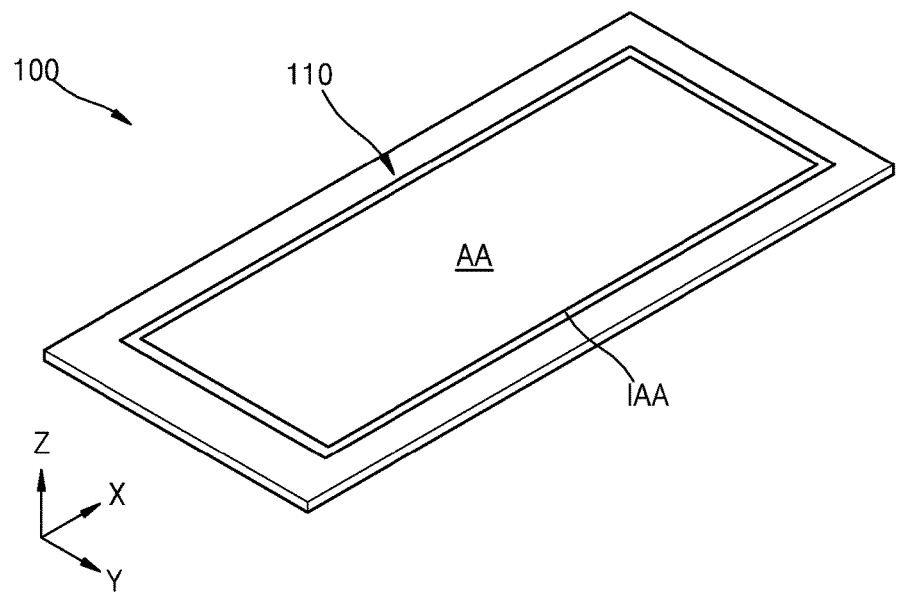
FIG. 1 is a perspective view of a display device according to an embodiment.

As the invention allows for various changes and numerous embodiments, exemplary embodiments will be illustrated in the drawings and described in detail in the written description. An effect and a characteristic of the invention, and a method of accomplishing these will be apparent when referring to embodiments described with reference to the drawings. The invention may, however, be embodied in many different forms and should not be construed as limited to the exemplary embodiments set forth herein.

Hereinafter, the invention will be described more fully with reference to the accompanying drawings, in which exemplary embodiments of the invention are shown. When description is made with reference to the drawings, like reference numerals in the drawings denote like or corresponding elements, and repeated description thereof will be omitted.

It will be understood that when a layer, region, or component is referred to as being "on," another layer, region, or component, it can be directly or indirectly formed on the other layer, region, or component. That is, for example, intervening layers, regions, or components may be present. Sizes of elements in the drawings may be exaggerated for convenience of explanation. In other words, since sizes and thicknesses of components in the drawings are arbitrarily illustrated for convenience of explanation, the following embodiments are not limited thereto.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath," "below," "lower," "above," "over," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the exemplary term "below" can encompass both an orientation of above and below. The device may be otherwise oriented (rotated 90 degrees or at other orientations) and the spatially relative descriptors used herein interpreted accordingly.

Herein, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, exemplary embodiments of a display device according to the invention will be described more fully with reference to the accompanying drawings, in which embodiments of the invention are shown. When description is made with reference to the drawings, like reference numerals in the drawings denote like or corresponding elements, and repeated description thereof may be omitted.

FIG. 1 is a perspective view of a display device 100 according to an embodiment.

Referring to FIG. 1, an embodiment of the display device 100 may include a display panel 110. The display panel 110 may be a rigid panel or a flexible panel.

The display panel 110 may include an active area AA for displaying an image and an inactive area IAA extending along an outside of the active area AA. In an embodiment, the inactive area IAA surrounds the active area AA. The active area AA may extend in a lengthwise direction (an x-direction) of the display panel 110, but the embodiment is not limited thereto.

Figure 2:
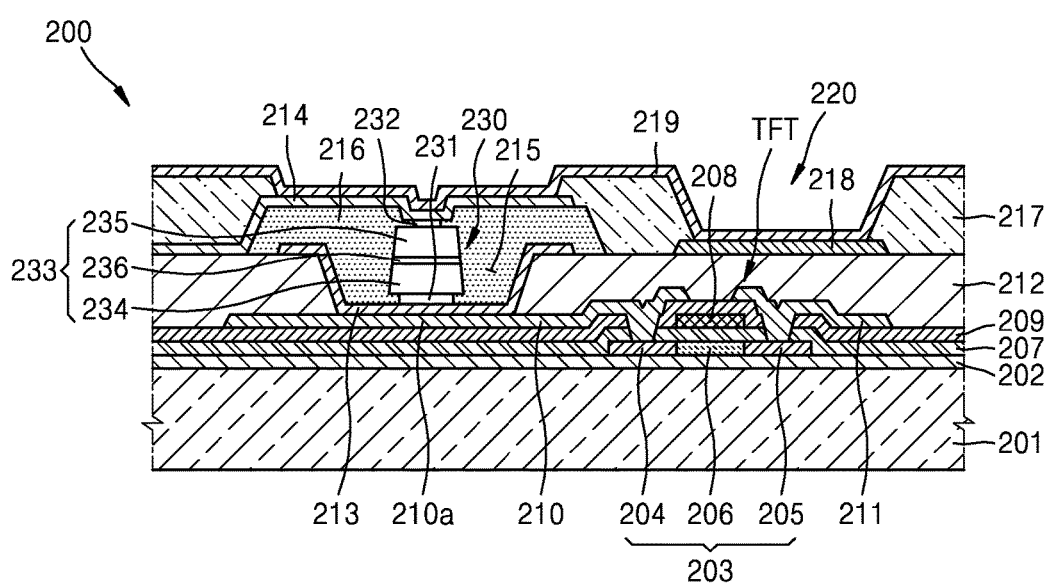
FIG. 2 is a cross-sectional view of one sub-pixel of a display device according to an embodiment.

FIG. 2 is a cross-sectional view of one sub-pixel of a display device 200 according to an embodiment.

Referring to FIG. 2, in an embodiment, the display device 200 may include a display substrate (or a base substrate) 201. The display substrate 201 may be a rigid glass substrate, a flexible glass substrate, or a flexible polymer substrate. The display substrate 201 may be transparent, semi-transparent, or opaque.

In an embodiment, the display device 200 includes a buffer layer 202 on the display substrate 201.

The buffer layer 202 may entirely cover the upper surface of the display substrate 201. The buffer layer 202 may include an inorganic material or an organic material. The buffer layer 202 may be a single layer or a multiple-layer.

In an embodiment, the display device 200 includes a thin film transistor ("TFT") on the buffer layer 202. The TFT may include a semiconductor active layer 203, a gate electrode 208, a source electrode 210 and a drain electrode 211.

In an embodiment, the TFT is a top-gate type TFT. However, in an alternative embodiment, the TFT may be a bottom-gate type TFT.

In an embodiment, at least one TFT may be in each sub-pixel.

The semiconductor active layer 203 may be on the buffer layer 202.

The semiconductor active layer 203 may include a source region 204 and a drain region 205 doped with N-type impurity ions or P-type impurity ions. A region between the source region 204 and the drain region 205 may be a channel region 206 undoped with impurities. The semiconductor active region 203 may include at least one of an organic semiconductor, an inorganic semiconductor, and amorphous silicon. In an alternative embodiment, the semiconductor active layer 203 may be an oxide semiconductor.

In an embodiment, the display device 200 includes a gate insulating layer 207 on the semiconductor active layer 203. The gate insulating layer 207 may include an inorganic material. The gate insulating layer 207 may have a single layer structure or a multiple-layer structure.

The gate electrode 208 may be on the gate insulating layer 207. The gate electrode 208 may include a metallic material having high conductivity. The gate electrode 208 may have a single layer structure or a multiple-layer structure.

In an embodiment, the display device 200 includes an interlayer insulating layer 209 on the gate electrode 208. The interlayer insulating layer 209 may include an inorganic material or an organic material.

The source electrode 210 and the drain electrode 211 may be on the interlayer insulating layer 209. Contact holes are defined through the gate insulating layer 207 and the interlayer insulating layer 209. In an embodiment, contact holes may be formed by removing a portion of the gate insulating layer 207 and a portion of the interlayer insulating layer 209. In such an embodiment, the source electrode 210 may be electrically connected to the source region 204 via a contact hole of the contact holes, and the drain electrode 211 may be electrically connected to the drain region 205 via a contact hole of the contact holes.

In an embodiment, the display device 200 includes a bank layer 212 on the source electrode 210 and the drain electrode 211. The bank layer 212 may cover the TFT. The bank layer 212 may include an inorganic material or an organic material. The bank layer 212 may be transparent or opaque. In an embodiment, the bank layer 212 may define each sub-pixel.

An opening 215 may be defined through the bank layer 212. The opening 215 may be formed by removing a portion of the bank layer 212.

In an embodiment, the display device 200 includes an extension portion 210a extending from the source electrode 210 and disposed in the opening 215. In an embodiment, an extension portion defined by an extension from the drain electrode 211 may be in the opening 215.

In an embodiment, the display device 200 includes an emission layer 230 in the opening 215. The emission layer 230 is not over or below the TFT or does not overlap the TFT when viewed from a top plan view, but the emission layer 230 may be spaced apart from the TFT in a horizontal direction of the display substrate 201. Herein, the horizontal direction of the display substrate may be a direction perpendicular to a thickness direction of the display substrate 201.

The emission layer 230 may emit light of a predetermined wavelength in a wavelength region of an ultraviolet ("UV") ray to visible light. The emission layer 230 may be a micro light-emitting diode ("LED"). In an embodiment, the emission layer 230 may include at least one of a red LED, a green LED, a blue LED, a white LED, and a UV LED.

The emission layer 230 may include a first contact electrode 231, a second contact electrode 232, and a p-n diode 233 between the first and second contact electrodes 231 and 232.

The p-n diode 233 may include a lower p-doped layer 234, an upper n-doped layer 235, and a quantum well layer 236 between the p-doped layer 234 and the n-doped layer 235. In an alternative embodiment, the upper doped layer 235 may be a p-doped layer, and the lower doped layer 234 may be an n-doped layer.

The first contact electrode 231 may be under the lower p-doped layer 234. The second contact electrode 232 may be on the upper n-doped layer 235. The first and second contact electrodes 231 and 232 may include conductive paste or a conductive ball.

In an embodiment, as described above, the emission layer 230 may be a vertical LED in which the first contact electrode 231 and the second contact electrode 232 are vertically arranged, e.g., arranged in a vertical direction (thickness direction) of the display substrate, but the embodiment is not limited thereto. In one alternative embodiment, for example, the emission layer 230 may be a horizontal LED in which the first contact electrode 231 and the second contact electrode 232 are horizontally arranged.

In an embodiment, the display device 200 includes a first electrode 213 below the emission layer 230. The first electrode 213 may be in the opening 215. The first electrode 213 may electrically connect the TFT to the emission layer 230. In an embodiment, the first electrode 213 may be between the emission layer 230 and the extension portion 210a extending from the source electrode 210. The upper surface of the first electrode 213 may be electrically connected to the first contact electrode 231. The lower surface of the first electrode 213 may be electrically connected to the extension portion 210a of the source electrode 210.

The first electrode 213 may include a transparent electrode or a metallic electrode. In one embodiment, for example, the first electrode 213 is a reflective electrode, and the first electrode 213 includes a reflective layer and a transparent conductive layer over the reflective layer.

In an embodiment, the reflective layer includes Ag, Mg, Al, Pt, Pd, Au, Ni, Nd, Mo, Ti, Ir, Cr, and a compound thereof having high reflectivity. The reflective layer may include a material that may reflect light emitted from the emission layer 230, but not being specifically limited.

In an embodiment, the transparent conductive layer includes indium tin oxide ("ITO"), indium zinc oxide ("IZO"), ZnO or $In_2O_3$.

In an embodiment, the display device 200 includes a second electrode 214 over the emission layer 230. The second electrode 214 may be a common electrode. In an alternative embodiment, the second electrode 214 may be patterned for each sub-pixel.

The second electrode 214 may include a transparent electrode or a metallic electrode.

In an embodiment, where the second electrode 214 is a transparent electrode, the second electrode 214 may include a conductive layer including a metal having a small work function, e.g., Li, Ca, LiF/Ca, LiF/Al, Al, Ag, Mg, or a compound thereof, and an auxiliary electrode including a material for a transparent electrode such as ITO, IZO, ZnO or $In_2O_3$. In such an embodiment, the auxiliary electrode may be over the conductive layer.

In an embodiment, where the second electrode 214 is a reflective electrode, the second electrode 214 may include at least one of Li, Ca, LiF/Ca, LiF/Al, Al, Ag, Mg, and a compound thereof.

In an embodiment, the second electrode 214 may be a transflective metal layer. In one embodiment, for example, the second electrode 214 may include an alloy of Mg and Ag, or a metal such as Ag, Al, Pt, and Cr, or an alloy of such metallic materials. The second electrode 214 may transmit or reflect a portion of light emitted from the emission layer 230 by appropriately adjusting the thickness of the transflective metal layer.

In an embodiment, the display device 200 includes a color filter layer 216 arranged around the emission layer 230. The color filter layer 216 may bury the emission layer 230. In an embodiment, the color filter layer 216 may substantially entirely cover the emission layer 230 except for the first and second contact electrodes 231 and 232. The color filter layer 216 having a color corresponding to the emission layer 230 may be arranged for each sub-pixel.

The second electrode 214 may be on the color filter layer 216. The second electrode 214 may be electrically connected to the second contact electrode 232.

In an embodiment, the display device 200 includes an insulating layer 217 over the color filter layer 216. The insulting layer 217 may be on the bank layer 212. The insulating layer 217 may be arranged around a sub-pixel. The insulating layer 217 may include a black matrix.

In an embodiment, an opening 220 may be defined through the insulating layer 217, e.g., formed by removing a portion of the insulating layer 217 vertically overlapping the TFT. A mirror layer 218 may be on a portion of the bank layer 212 that is exposed via the opening 220. The mirror layer 218 may be on the bank layer 212 in a vertical direction of the display substrate 201, and the TFT may be under the bank layer 212.

The mirror layer 218 may reflect light incident from an outside. The mirror layer 218 includes a reflective material. The mirror layer 218 may be formed during a same process as the first electrode 213. The mirror layer 218 may include a same material as the first electrode 213.

In an embodiment, the display device 200 includes a sealing layer 219 may be the outermost layer of the display substrate 201 to protect elements over the display substrate 201. The sealing layer 219 may include an inorganic layer. In an alternative embodiment, the sealing layer 219 may include at least one inorganic layer and at least one organic layer alternately stacked one on another. In another alternative embodiment, the sealing layer 219 may include glass. A sealing portion for coupling the display substrate 201 to the sealing layer 219 may be on a plane facing the display substrate 201 and the sealing layer 219.

In such an embodiment, the TFT and the emission layer 230 of the display device 200 are arranged in the horizontal direction of the display substrate 201 as described above, such that the thickness of the display device 200 may be reduced.

In an embodiment, the mirror layer 218 is on a portion of the bank layer 212 covering the TFT, such that light efficiency may improve.

In an embodiment, the first electrode 213 includes a reflective material, such that the first electrode 213 may reflect light irradiated from the emission layer 230 in an upward direction. Therefore, light efficiency may improve.

In an embodiment, the first electrode 213 is electrically connected to the extension portion 210a extending from the source electrode 210, such that the structure of the display device 200 may be simplified.

Figure 3:
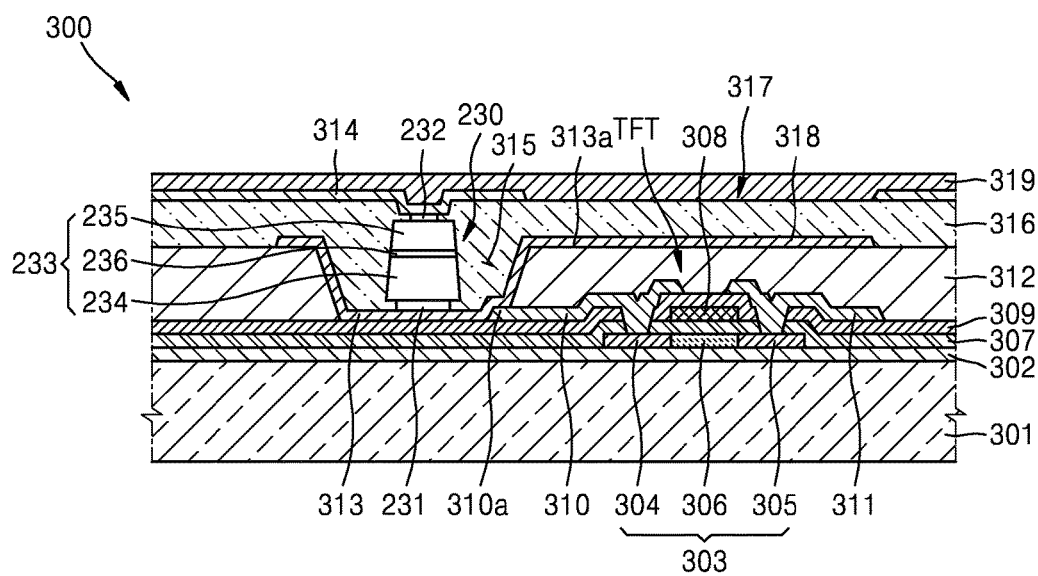
FIG. 3 is a cross-sectional view of one sub-pixel of a display device according to an alternative embodiment.

FIG. 3 is a cross-sectional view of one sub-pixel of a display device 300 according to an alternative embodiment.

The same or like elements shown in FIG. 3 have been labeled with the same reference characters as used above to describe the embodiments of the sub-pixel of a display device shown in FIG. 2, and any repetitive detailed description thereof will hereinafter be omitted or simplified.

Referring to FIG. 3, an embodiment of the display device 300 includes a display substrate 301. In such an embodiment, a buffer layer 302 may be on the display substrate 301.

A TFT may be on the buffer layer 302. The TFT includes a semiconductor active layer 303, a gate electrode 308, a source electrode 310, and a drain electrode 311.

The semiconductor active layer 303 may be on the buffer layer 302.

The semiconductor active layer 303 includes a source region 304, a drain region 305, and a channel region 306. A gate insulating layer 307 may be on the semiconductor active layer 303. The gate electrode 308 may be on the gate insulating layer 307.

An interlayer insulating layer 309 may be on the gate electrode 308. The source electrode 310 and the drain electrode 311 may be on the interlayer insulating layer 309. The source electrode 310 may be electrically connected to the source region 304, and the drain electrode 311 may be electrically connected to the drain region 305.

The bank layer 312 may be on the source electrode 310 and the drain electrode 311. The bank layer 312 may cover the TFT. An opening 315 may be defined through the bank layer 312, e.g., formed by removing a portion of the bank layer 312.

An edge 310a of the source electrode 310 may be arranged in the opening 315. In an alternative embodiment, an edge of the drain electrode 311 may be arranged in the opening 315.

The emission layer 230 may be arranged in the opening 315. The emission layer 230 may be adjacent to the TFT in the horizontal direction of the display substrate 301.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 313 may be below the emission layer 230. The first electrode 313 may be arranged in the opening 315. The first electrode 313 may cover an edge 310a of the source electrode 310 that is exposed via the opening 315. The first electrode 313 may be electrically connected to the first contact electrode 231. The first electrode 313 may be a reflective electrode.

An insulating layer 316 may be over the bank layer 312. The insulating layer 316 may be a planarization layer. The insulating layer 316 may cover the bank layer 312. The insulating layer 316 may bury the emission layer 230. In an embodiment, the insulating layer 316 may substantially entirely cover the emission layer 230 except for the first and second contact electrodes 231 and 232.

A mirror layer 318 may be on the bank layer 312. The mirror layer 318 may be on the bank layer 312 in a vertical direction of the display substrate 301, and the TFT are under the bank layer 312.

In an embodiment, the mirror layer 318 may be defined by an extension portion 313a of the first electrode 313. In such an embodiment, the first electrode 313 may extend from the bottom of the bank layer 312 that contacts the opening 315 to the lateral surface of the bank layer 312. In such an embodiment, the first electrode 313 may extend from the lateral surface of the bank layer 312 to the upper surface of the bank layer 312 covering the TFT.

The mirror layer 318 includes a reflective material. The mirror layer 318 may be formed during the same process as a process of the first electrode 313.

In an embodiment, a second electrode 314 may be over the emission layer 230. The second electrode 314 may be on the insulating layer 316. The second electrode 314 may be electrically connected to the second contact electrode 232. The second electrode 314 may be a common electrode. In an embodiment, the second electrode 314 may be patterned for each sub-pixel. The second electrode 314 includes a transparent electrode. In an embodiment, the second electrode 314 may include an opening 317 in a portion vertically corresponding to the mirror layer 318.

A sealing layer 319 may define the outermost layer of the display substrate 301 to protect elements over the display substrate 301. The sealing layer 319 includes an inorganic layer. In an alternative embodiment, the sealing layer 319 may include at least one inorganic layer and at least one organic layer alternately stacked one on another. In another alternative embodiment, the sealing layer 319 may include glass. A sealing portion for coupling the display substrate 301 to the sealing layer 319 may be on a plane facing the display substrate 301 and the sealing layer 319.

In such an embodiment, the TFT and the emission layer 230 of the display device 300 are arranged in the horizontal direction of the display substrate 301 as described above, such that the thickness of the display device 300 may be reduced.

In an embodiment, the mirror layer 318 corresponding to the extension portion 313a of the first electrode 313 is on a portion of the bank layer 312 covering the TFT, such that light efficiency may improve.

In an embodiment, the first electrode 313 is electrically connected to the edge 310a of the source electrode 310, such that the structure of the display device 300 may be simplified.

In an embodiment, the opening 317 defined through the second electrode 314 is arranged in a vertical direction of the mirror layer 318, such that light incident from outside may be efficiently reflected.

Figure 4:
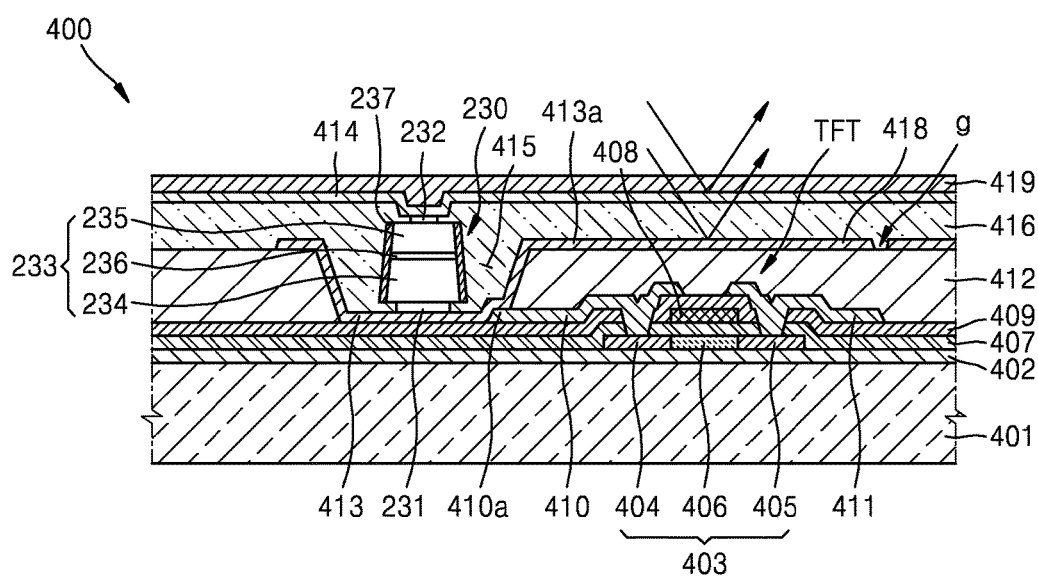
FIGS. 4 to 14 are cross-sectional views of one sub-pixel of a display device according to other alternative embodiments.

FIG. 4 is a cross-sectional view of one sub-pixel of a display device 400 according to another alternative embodiment.

Referring to FIG. 4, an embodiment of the display device 400 includes a display substrate 401. A buffer layer 402 may be on the display substrate 401.

A TFT may be on the buffer layer 402. The TFT includes a semiconductor active layer 403, a gate electrode 408, a source electrode 410, and a drain electrode 411.

The semiconductor active layer 403 may be on the buffer layer 402.

The semiconductor active layer 403 includes a source region 404, a drain region 405, and a channel region 406. A gate insulating layer 407 may be on the semiconductor active layer 403. The gate electrode 408 may be on the gate insulating layer 407.

An interlayer insulating layer 409 may be on the gate electrode 408. The source electrode 410 and the drain electrode 411 may be on the interlayer insulating layer 409. The source electrode 410 may be electrically connected to the source region 404, and the drain electrode 411 may be electrically connected to the drain region 405.

A bank layer 412 may be on the source electrode 410 and the drain electrode 411. The bank layer 412 may cover the TFT. An opening 415 may be defined through the bank layer 412, e.g., formed by removing a portion of the bank layer 412.

An edge 410a of the source electrode 410 may be arranged in the opening 415. In an alternative embodiment, an edge of the drain electrode 411 may be arranged in the opening 415.

The emission layer 230 may be arranged in the opening 415. The emission layer 230 may be adjacent to the TFT in the horizontal direction of the display substrate 401.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 413 may be below the emission layer 230. The first electrode 413 may be arranged in the opening 415. The first electrode 413 may cover an edge 410a of the source electrode 410 that is exposed via the opening 415. The first electrode 413 may be electrically connected to the first contact electrode 231. The first electrode 413 may be a reflective electrode.

An insulating layer 416 may be over the bank layer 412. The insulating layer 416 may be a planarization layer. The insulating layer 416 may cover the bank layer 412. In an embodiment, the insulating layer 416 may bury the emission layer 230. In an embodiment, the insulating layer 416 may substantially entirely cover the emission layer 230 except for the first and second contact electrodes 231 and 232.

A mirror layer 418 may be on the bank layer 412. The mirror layer 418 may be on the bank layer 412 in a vertical direction of the display substrate 401, and the TFT is under the bank layer 412.

In an embodiment, the mirror layer 418 may defined by an extension portion 413a of the first electrode 413. In such an embodiment, the first electrode 413 may extend from the bottom of the bank layer 412 that contacts the opening 415 to the lateral surface of the bank layer 412. In such an embodiment, the first electrode 413 may extend from the lateral surface of the bank layer 412 to the upper surface of the bank layer 412 covering the TFT. In an embodiment, the first electrode 413 may be arranged in each sub-pixel. In such an embodiment, the first electrodes 413 arranged in adjacent sub-pixels may be separated from each other.

The mirror layer 418 includes a reflective material. The mirror layer 418 may be formed during a same process as the first electrode 413.

A second electrode 414 may be over the emission layer 230. The second electrode 414 may be on the insulating layer 416. The second electrode 414 may be electrically connected to the second contact electrode 232. The second electrode 414 may be a common electrode. The second electrode 414 includes a transparent electrode or a transflective electrode.

The second electrode 414 and the mirror layer 418 may define a stacked structure. Specifically, the second electrode 414 may overlap the mirror layer 418 in a vertical direction of the display substrate 401 over the bank layer 412 covering the TFT with the insulating layer 416 arranged between the second electrode 414 and the mirror layer 418.

In such an embodiment, the second electrode 414 covers the insulating layer 416, such that the second electrode 414 may cover a gap g between the plurality of first electrodes 413 separated in adjacent sub-pixels. Therefore, the second electrode 414 and the mirror layer 418 may reflect light incident from an outside seamlessly and improve reflectivity.

In an embodiment, a lateral reflective layer 237 may be on a lateral surface of the emission layer 230. The lateral reflective layer 237 may reflect light irradiated to the lateral surface of the emission layer 230. In such an embodiment, the lateral reflective layer 237 is on the lateral surface of the emission layer 230, such that the emission layer 230 may irradiate light upward only. The lateral reflective layer 237 may include TiOx.

A sealing layer 419 may define the outermost layer of the display substrate 401 to protect elements over the display substrate 401. The sealing layer 419 includes an inorganic layer. In an alternative embodiment, the sealing layer 419 may include at least one inorganic layer and at least one organic layer alternately stacked one on another. In another alternative embodiment, the sealing layer 419 may include glass. A sealing portion for coupling the display substrate 401 to the sealing layer 419 may be on a plane facing the display substrate 401 and the sealing layer 419.

In an embodiment, since the TFT and the emission layer 230 of the display device 400 are arranged in the horizontal direction of the display substrate 401 as described above, the thickness of the display device 400 may be reduced.

In an embodiment, since the mirror layer 418 corresponding to the extension portion 413a of the first electrode 413 on the bank layer 412 covering the TFT overlaps the second electrode 414, reflectivity may improve.

In an embodiment, since the first electrode 413 is electrically connected to the edge 410a of the source electrode 410, the structure of the display device 400 may be simplified.

In an embodiment, since the lateral reflective layer 237 is provided on the lateral surface of the emission layer 230, light of an adjacent sub-pixel may be prevented from being mixed in the lateral surface of the emission layer 230.

Figure 5:
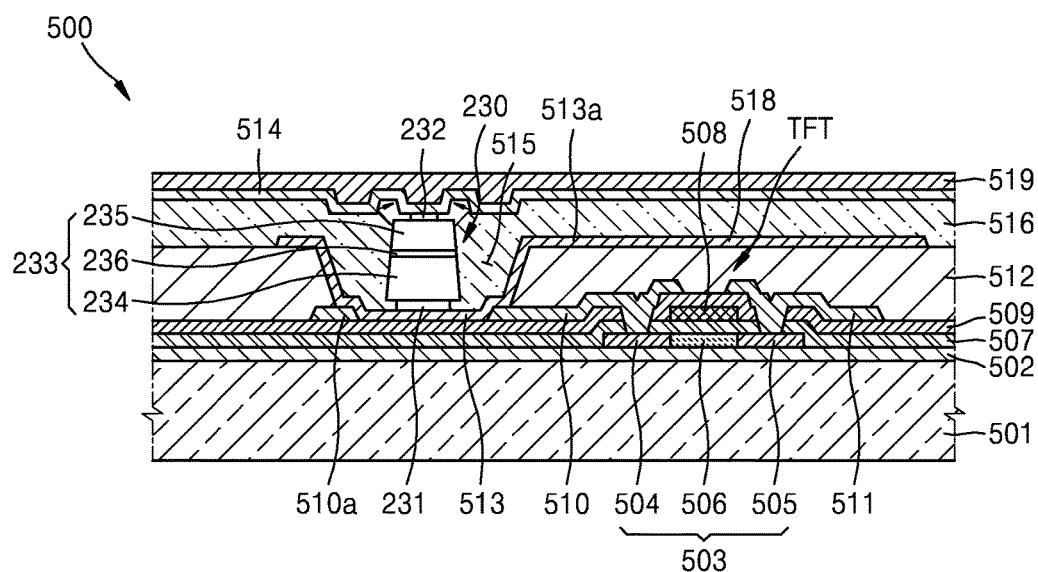

FIG. 5 is a cross-sectional view of one sub-pixel of a display device 500 according to other alternative embodiments.

Referring to FIG. 5, the display device 500 includes a display substrate 501. A buffer layer 502 may be on the display substrate 501.

A TFT may be on the buffer layer 502. The TFT includes a semiconductor active layer 503, a gate electrode 508, a source electrode 510, and a drain electrode 511.

The semiconductor active layer 503 may be on the buffer layer 502.

The semiconductor active layer 503 includes a source region 504, a drain region 505, and a channel region 506. A gate insulating layer 507 may be on the semiconductor active layer 503. The gate electrode 508 may be on the gate insulating layer 507.

An interlayer insulating layer 509 may be on the gate electrode 508. The source electrode 510 and the drain electrode 511 may be on the interlayer insulating layer 509. The source electrode 510 may be electrically connected to the source region 504, and the drain electrode 511 may be electrically connected to the drain region 505.

A bank layer 512 may be on the source electrode 510 and the drain electrode 511. The bank layer 512 may cover the TFT. An opening 515 may be defined through the bank layer 512, e.g., formed by removing a portion of the bank layer 512.

An extension portion 510a of the source electrode 510 may be arranged in the opening 515. The extension portion 510a may be connected to the source electrode 510 as a single unitary and indivisible unit. The extension portion 510a of the source electrode 510 may have a ring shape. In an embodiment, an extension portion of the drain electrode 511 may be arranged in the opening 515.

The emission layer 230 may be arranged in the opening 515. The emission layer 230 may be adjacent to the TFT in a horizontal direction of the display substrate 501.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 513 may be below the emission layer 230. The first electrode 513 may be arranged in the opening 515. The first electrode 513 may cover the extension portion 510a of the source electrode 510 that is exposed via the opening 515. The first electrode 513 may be electrically connected to the first contact electrode 231. The first electrode 513 may be a reflective electrode.

An insulating layer 516 may be over the bank layer 512. The insulating layer 516 may be a planarization layer. The insulating layer 516 may cover the bank layer 512. In an embodiment, the insulating layer 516 may bury the emission layer 230. In an embodiment, the insulating layer 516 may substantially entirely cover the emission layer 230 except for the first and second contact electrodes 231 and 232.

A mirror layer 518 may be on the bank layer 512. The mirror layer 518 may be on the bank layer 412 in a vertical direction of the display substrate 501, and the TFT may be under the bank layer 512.

In an embodiment, the mirror layer 518 may be defined by an extension portion 513a of the first electrode 513. The first electrode 513 may extend to the upper surface of the bank layer 512 covering the TFT. In an embodiment, the first electrode 513 may be arranged in each sub-pixel.

The mirror layer 518 includes a reflective material. The mirror layer 518 may be formed during a same process as the first electrode 513.

A second electrode 514 may be over the emission layer 230. The second electrode 514 may be on the insulating layer 516. The second electrode 514 may be electrically connected to the second contact electrode 232. The second electrode 514 may be a common electrode. The second electrode 514 includes a transparent electrode or a transflective electrode.

The second electrode 514 may overlap the mirror layer 518 in a vertical direction of the display substrate 501 over the bank layer 512 covering the TFT with the insulating layer 516 arranged between the second electrode 514 and the mirror layer 518.

In an embodiment, a portion of the insulating layer 516 may have a trench shape. The portion of the insulating layer 516 having a trench shape may be arranged around the emission layer 230. The second electrode 514 may be arranged on an upper surface of the insulating layer 516. A portion of the second electrode 514 around the emission layer 230 may have a trench shape corresponding to the shape of the portion of the insulating layer 516 around the emission layer 230. When the emission layer 230 emits light, light irradiated from the emission layer 230 may be reflected in an upward direction by the portion of the second electrode 513 having the trench shape.

A sealing layer 519 may define the outermost layer of the display substrate 501 to protect elements over the display substrate 501. The sealing layer 519 includes an inorganic layer. In an alternative embodiment, the sealing layer 519 may include at least one inorganic layer and at least one organic layer alternately stacked one on another. In another alternative embodiment, the sealing layer 519 may include glass. A sealing portion for coupling the display substrate 501 to the sealing layer 519 may be on a plane facing the display substrate 501 and the sealing layer 519.

In an embodiment, since the TFT and the emission layer 230 of the display device 500 are arranged in the horizontal direction of the display substrate 501 as described above, the thickness of the display device 500 may be reduced.

In an embodiment, since the mirror layer 518 corresponding to the extension portion 513a of the first electrode 513 on the bank layer 512 covering the TFT overlaps the second electrode 514, reflectivity may improve.

In an embodiment, since the first electrode 513 is electrically connected to the extension portion 510a of the source electrode 510 having a ring shape, the structure of the display device 500 may be simplified.

In an embodiment, since the insulating layer 516 and the second electrode 514 having a trench shape are arranged around the emission layer 230, light of adjacent sub-pixels is prevented from being mixed around the emission layer 230.

Figure 6:
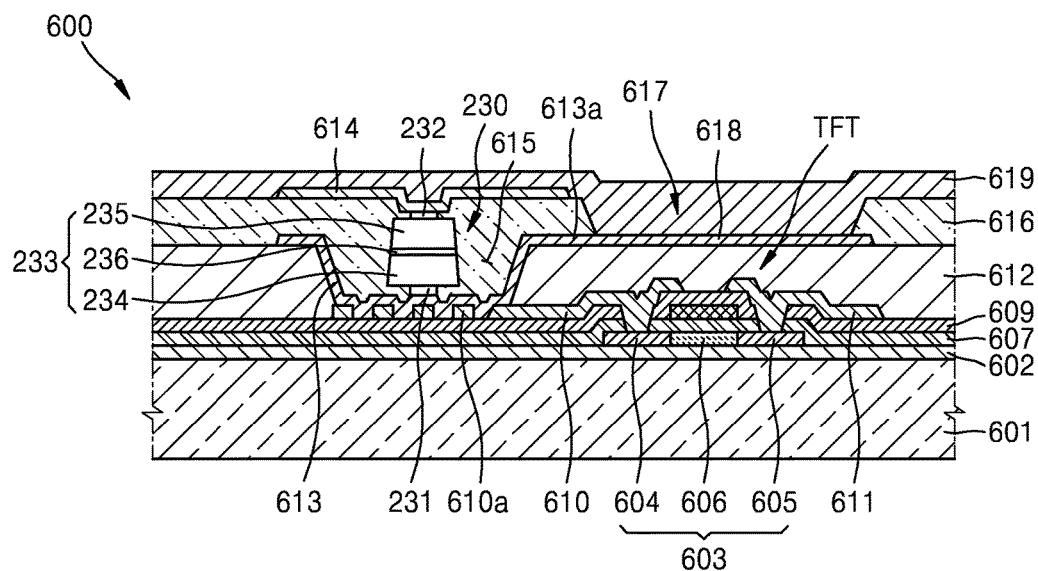

FIG. 6 is a cross-sectional view of one sub-pixel of a display device 600 according to another alternative embodiment.

Referring to FIG. 6, an embodiment of the display device 600 includes a display substrate 601. A buffer layer 602 may be on the display substrate 601.

A TFT may be on the buffer layer 602. The TFT includes a semiconductor active layer 603, a gate electrode 608, a source electrode 610, and a drain electrode 611.

The semiconductor active layer 603 may be on the buffer layer 602.

The semiconductor active layer 603 includes a source region 604, a drain region 605, and a channel region 606. A gate insulating layer 607 may be on the semiconductor active layer 603. The gate electrode 608 may be on the gate insulating layer 607.

An interlayer insulating layer 609 may be on the gate electrode 608. The source electrode 610 and the drain electrode 611 may be on the interlayer insulating layer 609. The source electrode 610 may be electrically connected to the source region 604, and the drain electrode 611 may be electrically connected to the drain region 605.

A bank layer 612 may be on the source electrode 610 and the drain electrode 611. The bank layer 612 may cover the TFT. An opening 615 may be defined through the bank layer 612, e.g., formed by removing a portion of the bank layer 612.

An extension portion 610a of the source electrode 610 may be arranged in the opening 615. The extension portion 610a may be connected to the source electrode 610 as a single unitary and indivisible unit. The extension portion 610a of the source electrode 610 may have a zigzag shape. In an embodiment, an extension portion of the drain electrode 611 may be arranged in the opening 615.

The emission layer 230 may be arranged in the opening 615. The emission layer 230 may be adjacent to the TFT in a horizontal direction of the display substrate 601.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 613 may be below the emission layer 230. The first electrode 613 may be arranged in the opening 615. The first electrode 613 may cover the extension portion 610a of the source electrode 610 that is exposed via the opening 615. In such an embodiment, since the extension portion 610a of the source electrode 610 has a zigzag shape, the first electrode 613 may be arranged on the upper portion of the extension portion 610a of the source electrode 610 and arranged in a space between the extension portions 610a. Therefore, a contact characteristic between the source electrode 610 and the first electrode 613 may improve. The first electrode 613 may be electrically connected to the first contact electrode 231. The first electrode 613 may be a reflective electrode.

An insulating layer 616 may be over the bank layer 612. The insulating layer 616 may be a planarization layer. The insulating layer 616 may cover the bank layer 612. In an embodiment, the insulating layer 616 may bury the emission layer 230. In an embodiment, the insulating layer 616 may substantially entirely cover the emission layer 230 except for the first and second contact electrodes 231 and 232. An opening 617 may be defined through the insulating layer 616 over a portion of the bank layer 612 covering the TFT. The opening 617 may be defined through the insulating layer 616, e.g., formed by removing a portion of the insulating layer 616.

A mirror layer 618 may be on the bank layer 612. The mirror layer 618 may be on the bank layer 612 in a vertical direction of the display substrate 601, and the TFT may be under the bank layer 612.

In an embodiment, the mirror layer 618 may correspond to an extension portion 613a of the first electrode 613. The first electrode 613 may extend to the upper surface of the bank layer 612 covering the TFT.

The mirror layer 618 may be defined by the extension portion 613a of the first electrode 613 that extends to the upper surface of the bank layer 612. The mirror layer 618 includes a reflective material. The mirror layer 618 may be formed during a same process as the first electrode 613.

A second electrode 614 may be over the emission layer 230. The second electrode 614 may be on the insulating layer 516. The second electrode 614 may be electrically connected to the second contact electrode 232. The second electrode 614 may be a common electrode. The second electrode 614 includes a transparent electrode or a transflective electrode. In an embodiment, the second electrode 614 may not be over the bank layer 612 covering the TFT. Since the second electrode 614 and the insulating layer 616 do not vertically overlap the mirror layer 618, reflectivity may improve.

A sealing layer 619 may define the outermost layer of the display substrate 601 to protect elements over the display substrate 601. The sealing layer 619 includes at least one inorganic layer. In an alternative embodiment, the sealing layer 619 may include at least one inorganic layer and at least one organic layer alternately stacked one on another. In another alternative embodiment, the sealing layer 619 may include glass. A sealing portion for coupling the display substrate 601 to the sealing layer 619 may be on a plane facing the display substrate 601 and the sealing layer 619.

In an embodiment, since the TFT and the emission layer 230 of the display device 600 are arranged in the horizontal direction of the display substrate 601 as described above, the thickness of the display device 600 may be reduced.

In an embodiment, since the mirror layer 618 is arranged on the bank layer 612 covering the TFT, light efficiency may improve.

In an embodiment, since the insulating layer 616 is not arranged on the bank covering the TFT, reflectivity may improve.

In an embodiment, since the first electrode 613 is electrically connected to the extension portion 610a of the source electrode 610 having a zigzag shape, a contact area may increase.

Figure 8:
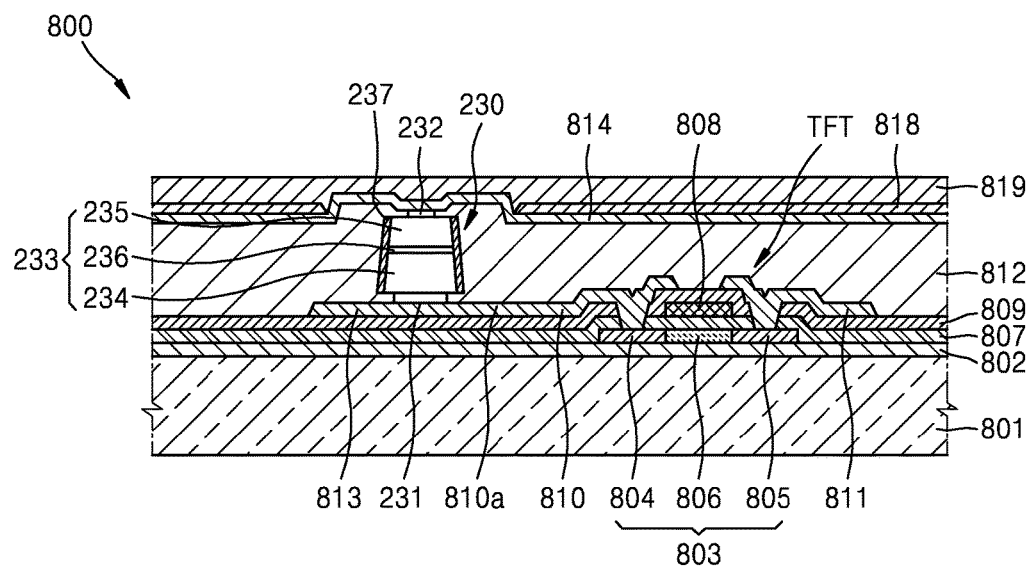
Figure 9:
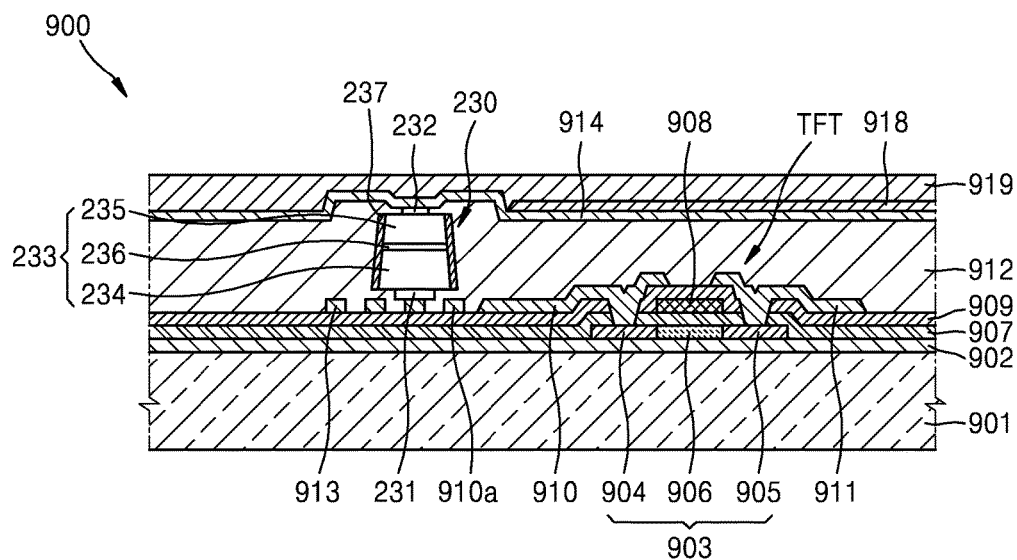

FIGS. 2 to 6 illustrate embodiments, where the first electrode is disposed over the display substrate by using a conductive layer, but not being limited thereto. In an alternative embodiment, one of the semiconductor active layer, a gate electrode, a source electrode, and a drain electrode of the TFT may be used as the first electrode as illustrated in FIGS. 7 to 9.

Figure 7:
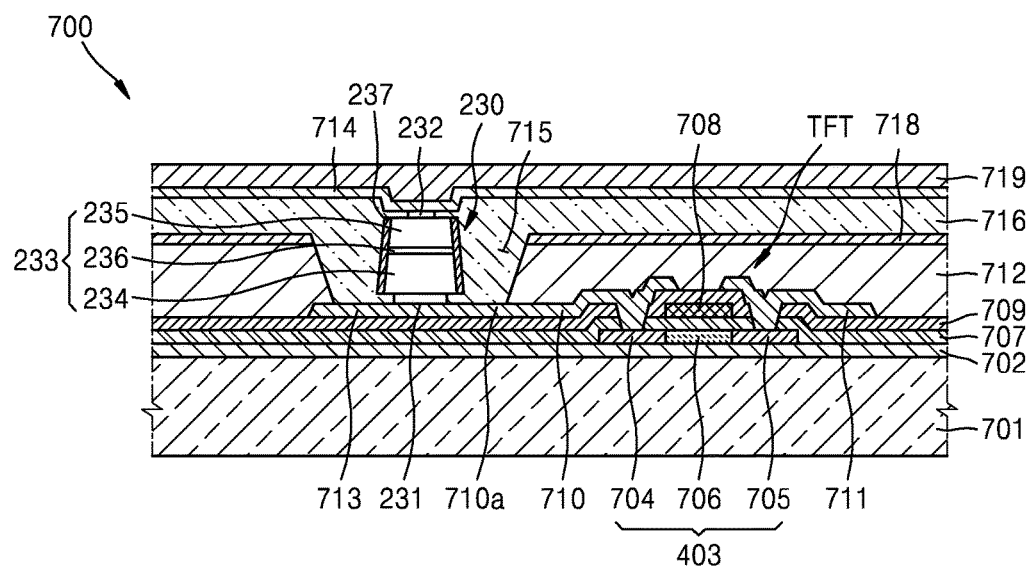

FIG. 7 is a cross-sectional view of one sub-pixel of a display device 700 according to another alternative embodiment.

Referring to FIG. 7, an embodiment of the display device 700 includes a display substrate 701. A buffer layer 702 may be on the display substrate 701.

A TFT may be on the buffer layer 702. The TFT includes a semiconductor active layer 703, a gate electrode 708, a source electrode 710, and a drain electrode 711.

The semiconductor active layer 703 may be on the buffer layer 702.

The semiconductor active layer 703 includes a source region 704, a drain region 705, and a channel region 706. A gate insulating layer 707 may be on the semiconductor active layer 703. The gate electrode 708 may be on the gate insulating layer 707.

An interlayer insulating layer 709 may be on the gate electrode 708. The source electrode 710 and the drain electrode 711 may be on the interlayer insulating layer 709. The source electrode 710 may be electrically connected to the source region 704, and the drain electrode 711 may be electrically connected to the drain region 705.

A bank layer 712 may be on the source electrode 710 and the drain electrode 711. The bank layer 712 may cover the TFT. An opening 715 may be defined through the bank layer 712, e.g., formed by removing a portion of the bank layer 712.

An extension portion 710a of the source electrode 710 may be arranged in the opening 715. The extension portion 710a of the source electrode 710 may define the first electrode 713. In an embodiment, an extension portion of the drain electrode 711 may be arranged in the opening 715.

The emission layer 230 may be arranged in the opening 715. The emission layer 230 may be adjacent to the TFT in a horizontal direction of the display substrate 701.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 713 corresponding to the extension portion 710a of the source electrode 710 may be below the emission layer 230. The first electrode 713 may be electrically connected to the first contact electrode 231. The first electrode 713 includes a reflective material.

An insulating layer 716 may be over the bank layer 712. The insulating layer 716 may be a planarization layer. The insulating layer 716 may cover the bank layer 712. In an embodiment, the insulating layer 716 may bury the emission layer 230. In an embodiment, the insulating layer 716 may substantially entirely cover the emission layer 230 except for the first and second contact electrodes 231 and 232.

A mirror layer 718 may be on the bank layer 712. The mirror layer 718 may be on the bank layer 712 in a vertical direction of the display substrate 701, and the TFT may be under the bank layer 712.

The mirror layer 718 may be separated from the first electrode 713 arranged below the emission layer 230. The mirror layer 718 includes a reflective material. The mirror layer 718 may be formed during a process different from a process for forming the first electrode 713.

A second electrode 714 may be over the emission layer 230. The second electrode 714 may be on the insulating layer 716. The second electrode 714 may be electrically connected to the second contact electrode 232. The second electrode 714 may be a common electrode. The second electrode 714 includes a transparent electrode or a transflective electrode.

The second electrode 714 may overlap the mirror layer 718 in a vertical direction of the display substrate 701 over the bank layer 712 covering the TFT with the insulating layer 716 arranged between the second electrode 714 and the mirror layer 718.

In an embodiment, the lateral reflective layer 237 may be disposed on the lateral surface of the emission layer 230. The lateral reflective layer 237 may reflect light irradiated to the lateral surface of the emission layer 230. In such an embodiment, since the lateral reflective layer 237 is on the lateral surface of the emission layer 230, the emission layer 230 may irradiate light upward only. The lateral reflective layer 237 may include TiOx.

A sealing layer 719 may define the outermost layer of the display substrate 701 to protect elements over the display substrate 701. The sealing layer 719 includes an inorganic layer. In an alternative embodiment, the sealing layer 719 may include at least one inorganic layer and at least one organic layer alternately stacked one on another. In another alternative embodiment, the sealing layer 719 may include glass. A sealing portion for coupling the display substrate 701 to the sealing layer 719 may be on a plane facing the display substrate 701 and the sealing layer 719.

In an embodiment, since the TFT and the emission layer 230 of the display device 700 are arranged in the horizontal direction of the display substrate 701 as described above, the thickness of the display device 700 may be reduced.

In an embodiment, since the second electrode 714 overlaps the mirror layer 718 on the bank layer 712 covering the TFT, reflectivity may improve.

In an embodiment, since the first electrode 713 corresponds to the extension portion 710a of the source electrode 719, the structure of the display device 700 may be simplified.

In an embodiment, since the lateral reflective layer 237 is provided on the lateral surface of the emission layer 230, light of an adjacent sub-pixel may be prevented from being mixed in the lateral surface of the emission layer 230.

FIG. 8 is a cross-sectional view of one sub-pixel of a display device 800 according to another alternative embodiment.

Referring to FIG. 8, an embodiment of the display device 800 includes a display substrate 801. A buffer layer 802 may be on the display substrate 801.

A TFT may be on the buffer layer 802. The TFT includes a semiconductor active layer 803, a gate electrode 808, a source electrode 810, and a drain electrode 811.

The semiconductor active layer 803 may be on the buffer layer 802.

The semiconductor active layer 803 includes a source region 804, a drain region 805, and a channel region 806. A gate insulating layer 807 may be on the semiconductor active layer 803. The gate electrode 808 may be on the gate insulating layer 807.

An interlayer insulating layer 809 may be on the gate electrode 808. The source electrode 810 and the drain electrode 811 may be on the interlayer insulating layer 809. The source electrode 810 may be electrically connected to the source region 804, and the drain electrode 811 may be electrically connected to the drain region 805.

A bank layer 812 may be on the source electrode 810 and the drain electrode 811. The bank layer 812 may cover the TFT. The bank layer 812 may be a planarization layer. In such an embodiment, as shown in FIG. 8, the bank layer 812 may not define each sub-pixel. Therefore, no opening is defined in the bank layer 812 over the display substrate 801.

An extension portion 810a of the source electrode 810 may be arranged in an emission region. The extension portion 810a of the source electrode 810 may define a first electrode 813. In an alternative embodiment, an extension portion of the drain electrode 811 may be arranged in the emission region.

The emission layer 230 may be over the extension portion 810a of the source electrode 810. The emission layer 230 may be adjacent to the TFT in the horizontal direction of the display substrate 801.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235. The first contact electrode 231 may be electrically connected to the first electrode 813.

A second electrode 814 may be over the emission layer 230. The second electrode 814 may be on bank layer 812. The second electrode 814 may be electrically connected to the second contact electrode 232. The second electrode 814 may be a common electrode. The second electrode 814 includes a transparent electrode or a transflective electrode.

A mirror layer 818 may be on the second electrode 814. The mirror layer 818 may be over the bank layer 812 in a vertical direction of the display substrate 801, and the TFT may be under the bank layer 812. The second electrode 814 and the mirror layer 818 may be stacked in the vertical direction of the display substrate 801 over the bank layer 812 covering the TFT. The mirror layer 818 may be separated from the first electrode 813 below the emission layer 230. The mirror layer 818 includes a reflective material.

The lateral reflective layer 237 may be disposed on the lateral surface of the emission layer 230. The lateral reflective layer 237 may reflect light irradiated to the lateral surface of the emission layer 230. In such an embodiment, since the lateral reflective layer 237 is on the lateral surface of the emission layer 230, the emission layer 230 may irradiate light upward only. The lateral reflective layer 237 may include TiOx.

A sealing layer 819 may define the outermost layer of the display substrate 801 to protect elements over the display substrate 801. The sealing layer 819 includes an inorganic layer. In an alternative embodiment, the sealing layer 819 may include at least one inorganic layer and at least one organic layer alternately stacked one on another. In another alternative embodiment, the sealing layer 819 may include glass. A sealing portion for coupling the display substrate 801 to the sealing layer 819 may be on a plane facing the display substrate 801 and the sealing layer 819.

In an embodiment, since the TFT and the emission layer 230 of the display device 800 are arranged in the horizontal direction of the display substrate 801 as described above, the thickness of the display device 800 may be reduced.

In an embodiment, since the second electrode 814 and the mirror layer 818 are stacked on the bank layer 812 covering the TFT, reflectivity may improve.

In an embodiment, since the first electrode 813 corresponds to the extension portion 810a of the source electrode 810, the structure of the display device 800 may be simplified.

In an embodiment, since the lateral reflective layer 237 is arranged on the lateral surface of the emission layer 230, light of an adjacent sub-pixel may be prevented from being mixed in the lateral surface of the emission layer 230.

FIG. 9 is a cross-sectional view of one sub-pixel of a display device 900 according to another alternative embodiment.

Referring to FIG. 9, an embodiment of the display device 900 includes a display substrate 901. A buffer layer 902 may be on the display substrate 901.

A TFT may be on the buffer layer 902. The TFT includes a semiconductor active layer 903, a gate electrode 908, a source electrode 910, and a drain electrode 911.

The semiconductor active layer 903 may be on the buffer layer 902.

The semiconductor active layer 903 includes a source region 904, a drain region 905, and a channel region 906. A gate insulating layer 907 may be on the semiconductor active layer 903. The gate electrode 908 may be on the gate insulating layer 907.

An interlayer insulating layer 909 may be on the gate electrode 908. The source electrode 910 and the drain electrode 911 may be on the interlayer insulating layer 909. The source electrode 910 may be electrically connected to the source region 904, and the drain electrode 911 may be electrically connected to the drain region 905.

A bank layer 912 may be on the source electrode 910 and the drain electrode 911. The bank layer 912 may cover the TFT. The bank layer 912 may be a planarization layer. The bank layer 912 does not define each sub-pixel. Therefore, an opening in which the emission layer 230 is arranged is not formed over the display substrate 901.

An extension portion 910a of the source electrode 910 may be arranged in an emission region. The extension portion 910a may be connected to the source electrode 910 as a single unitary and indivisible unit. The extension portion 910a of the source electrode 910 may have a zigzag shape. The extension portion 910a of the source electrode 910 may define a first electrode 913. In an alternative embodiment, an extension portion of the drain electrode 911 may be arranged in the emission region.

The emission layer 230 may be over the extension portion 910a of the source electrode 910. The emission layer 230 may be adjacent to the TFT in the horizontal direction of the display substrate 901.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235. The first contact electrode 231 may be electrically connected to the first electrode 913.

A second electrode 914 may be over the emission layer 230. The second electrode 914 may be on bank layer 912. The second electrode 914 may be electrically connected to the second contact electrode 232. The second electrode 914 may be a common electrode. The second electrode 914 includes a transparent electrode or a transflective electrode.

A mirror layer 918 may be on the second electrode 914. The mirror layer 918 may be on the bank layer 912 in a vertical direction of the display substrate 901, and the TFT may be under the bank layer 912. The second electrode 914 and the mirror layer 918 may be stacked in the vertical direction of the display substrate 901 over the bank layer 912 covering the TFT. The mirror layer 918 may be separated from the first electrode 913 below the emission layer 230. The mirror layer 918 includes a reflective material.

The lateral reflective layer 237 may be disposed on the lateral surface of the emission layer 230. The lateral reflective layer 237 may reflect light irradiated to the lateral surface of the emission layer 230. In such an embodiment, since the lateral reflective layer 237 is on the lateral surface of the emission layer 230, the emission layer 230 may irradiate light upward only. The lateral reflective layer 237 may include TiOx.

A sealing layer 919 may define the outermost layer of the display substrate 901 to protect elements over the display substrate 901. The sealing layer 919 includes an inorganic layer. In an alternative embodiment, the sealing layer 919 may include at least one inorganic layer and at least one organic layer alternately stacked one on another. In another alternative embodiment, the sealing layer 919 may include glass. A sealing portion for coupling the display substrate 901 to the sealing layer 919 may be on a plane facing the display substrate 901 and the sealing layer 919.

In an embodiment, since the TFT and the emission layer 230 of the display device 900 are arranged in the horizontal direction of the display substrate 901 as described above, the thickness of the display device 900 may be reduced.

In an embodiment, since the second electrode 914 and the mirror layer 918 are stacked on the bank layer 912 covering the TFT, reflectivity may improve.

In an embodiment, since the first electrode 913 is electrically connected to the extension portion 910a of the source electrode 910 having a zigzag shape, the first electrode 913 may diffuse-reflect light irradiated below the emission layer 230.

In an embodiment, since the lateral reflective layer 237 is arranged on the lateral surface of the emission layer 230, light of an adjacent sub-pixel may be prevented from being mixed in the lateral surface of the emission layer 230.

In other alternative embodiments, as illustrated in FIGS. 10 to 13, a conductive layer connected to one of the semiconductor active layer, the gate electrode, the source electrode and the drain electrode of the TFT is below the emission layer, and the conductive layer may be electrically connected to the first electrode.

Figure 10:
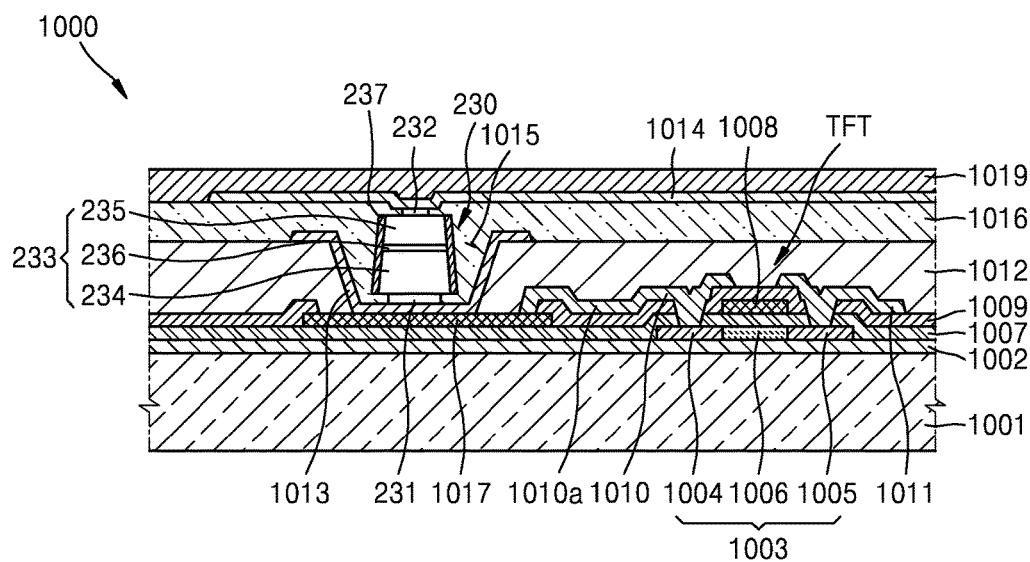

FIG. 10 is a cross-sectional view of one sub-pixel of a display device 1000 according to another alternative embodiment.

Referring to FIG. 10, an embodiment of the display device 1000 includes a display substrate 1001. A buffer layer 1002 may be on the display substrate 1001.

A TFT may be on the buffer layer 1002. The TFT includes a semiconductor active layer 1003, a gate electrode 1008, a source electrode 1010, and a drain electrode 1011.

The semiconductor active layer 1003 may be on the buffer layer 1002.

The semiconductor active layer 1003 includes a source region 1004, a drain region 1005, and a channel region 1006.

A gate insulating layer 1007 may be on the semiconductor active layer 1003. The gate electrode 1008 may be on the gate insulating layer 1007.

An interlayer insulating layer 1009 may be on the gate electrode 1008. The source electrode 1010 and the drain electrode 1011 may be on the interlayer insulating layer 1009. The source electrode 1010 may be electrically connected to the source region 1004, and the drain electrode 1011 may be electrically connected to the drain region 1005.

A bank layer 1012 may be on the source electrode 1010 and the drain electrode 1011. The bank layer 1012 may cover the TFT. An opening 1015 may be defined through the bank layer 1012, e.g., formed by removing a portion of the bank layer 1012.

A conductive layer 1017 may be in the opening 1015. The conductive layer 1017 may be formed during the same process as a process of the gate electrode 1008. The conductive layer 1017 may include the same material as that of the gate electrode 1008. In an alternative embodiment, the conductive layer 1017 may defined by one of the semiconductor active layer 1003, the source electrode 1010, and the drain electrode 1011.

The conductive layer 1017 may be electrically connected to an extension portion 1010a extending from the source electrode 1010. In an alternative embodiment, the conductive layer 1017 may be electrically connected to an extension portion of one of the semiconductor active layer 1003 and the drain electrode 1011.

The emission layer 230 may be in the opening 1015. The emission layer 230 may be adjacent to the TFT in the horizontal direction of the display substrate 1001.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 1013 may be below the emission layer 230. The first electrode 1013 may be in the opening 1015. The first electrode 1013 may be between the emission layer 230 and the conductive layer 1017. In an embodiment, the upper surface of the first electrode 1013 may be electrically connected to the first contact electrode 231. The bottom surface of the first electrode 1013 may be electrically connected to the conductive layer 1017. The first electrode 1013 may be a reflective electrode.

An insulating layer 1016 may be on the bank layer 1012. The insulating layer 1016 may be a planarization layer. The insulating layer 1016 may cover the bank layer 1012. In an embodiment, the insulating layer 1016 may bury the emission layer 230. In an embodiment, the insulating layer 1016 may substantially entirely cover the emission layer 230 except for the first and second contact electrodes 231 and 232.

A second electrode 1014 may be over the emission layer 230. The second electrode 1014 may be on the insulating layer 1016. The second electrode 1014 may be electrically connected to the second contact electrode 232. The second electrode 1014 may be a common electrode. The second electrode 1014 may include a transparent electrode or a transflective electrode.

A sealing layer 1019 may define the outermost layer of the display substrate 1001 to protect elements over the display substrate 1001. The sealing layer 1019 includes an inorganic layer. In alternative embodiment, the sealing layer 1019 may include at least one inorganic layer and at least one organic layer alternately stacked one on another. In another alternative embodiment, the sealing layer 1019 may include glass. A sealing portion for coupling the display substrate 1001 to the sealing layer 1019 may be on a plane facing the display substrate 1001 and the sealing layer 1019.

In an embodiment, since the TFT and the emission layer 230 of the display device 1000 are arranged in the horizontal direction of the display substrate 1001 as described above, the thickness of the display device 1000 may be reduced.

In an embodiment, since the conductive layer 1017 arranged in the same layer as the layer of the gate electrode 1008 is connected to the first electrode 1013, the emission layer 230 may be arranged closer to the display substrate 1001.

In an embodiment, a structure, in which the TFT and the emission layer 230 are horizontally arranged, may be selectively formed in a region in which the display device 1000 is folded.

In an embodiment, as described above, the display device 1000 may implement one of top emission, bottom emission, and dual emission depending on the physical properties of the first electrode 1013 and the second electrode 1014.

Figure 11:
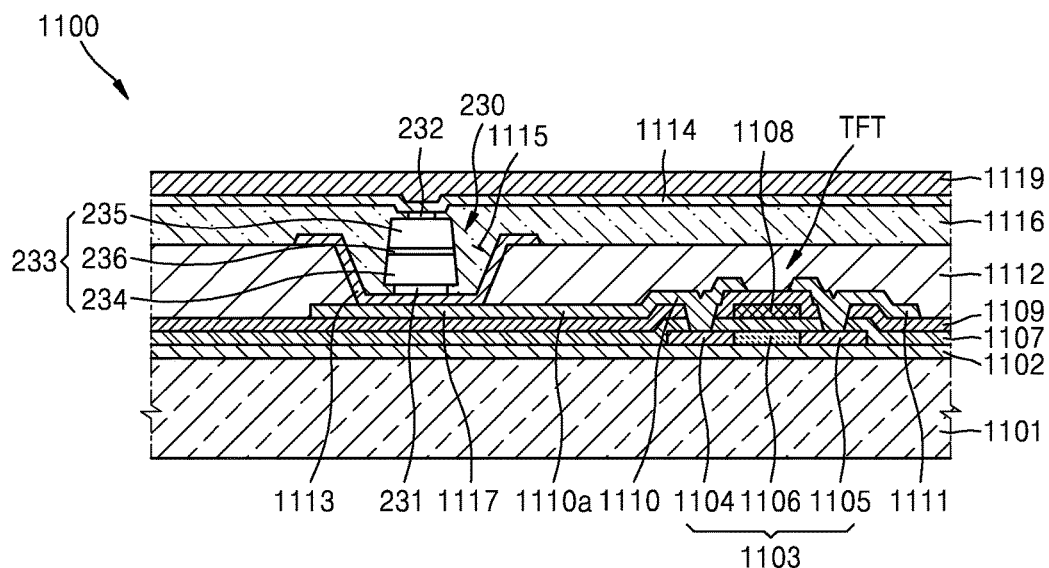

FIG. 11 is a cross-sectional view of one sub-pixel of a display device 1100 according to another alternative embodiment.

Referring to FIG. 11, an embodiment of the display device 1100 includes a display substrate 1101. A buffer layer 1102 may be on the display substrate 1101.

A TFT may be on the buffer layer 1102. The TFT includes a semiconductor active layer 1103, a gate electrode 1108, a source electrode 1110, and a drain electrode 1111.

The semiconductor active layer 1103 may be on the buffer layer 1102.

The semiconductor active layer 1103 includes a source region 1104, a drain region 1105, and a channel region 1106. A gate insulating layer 1107 may be on the semiconductor active layer 1103. The gate electrode 1108 may be on the gate insulating layer 1107.

An interlayer insulating layer 1109 may be on the gate electrode 1108. The source electrode 1110 and the drain electrode 1111 may be on the interlayer insulating layer 1109. The source electrode 1110 may be electrically connected to the source region 1104, and the drain electrode 1111 may be electrically connected to the drain region 1105.

A bank layer 1112 may be on the source electrode 1110 and the drain electrode 1111. The bank layer 1112 may cover the TFT. An opening 1115 may be defined through the bank layer 1112, e.g., formed by removing a portion of the bank layer 1112.

A conductive layer 1117 may be in the opening 1115. The conductive layer 1117 may be defined by an extension portion 1110a of the source electrode 1110. In an alternative embodiment, the conductive layer 1117 may be defined by an extension portion of one of the semiconductor active layer 1103, the gate electrode 1108, and the drain electrode 1111.

The emission layer 230 may be in the opening 1115. The emission layer 230 may be adjacent to the TFT in the horizontal direction of the display substrate 1101.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 1113 may be below the emission layer 230. The first electrode 1113 may be in the opening 1115. The first electrode 1113 may be between the emission layer 230 and the conductive layer 1117. The first electrode 1113 may be electrically connected to the first contact electrode 231. The first electrode 1113 may be a reflective electrode.

An insulating layer 1116 may be on the bank layer 1112. The insulating layer 1116 may be a planarization layer. The insulating layer 1116 may cover the bank layer 1112. In an embodiment, the insulating layer 1116 may bury the emission layer 230. In an embodiment, the insulating layer 1116 may substantially entirely cover the emission layer 230 except for the first and second contact electrodes 231 and 232.

A second electrode 1114 may be over the emission layer 230. The second electrode 1114 may be on the insulating layer 1116. The second electrode 1114 may be electrically connected to the second contact electrode 232. The second electrode 1114 may be a common electrode. The second electrode 1114 may include a transparent electrode.

A sealing layer 1119 may define the outermost layer of the display substrate 1101 to protect elements over the display substrate 1101. The sealing layer 1119 includes an inorganic layer. In an alternative embodiment, the sealing layer 1119 may include at least one inorganic layer and at least one organic layer alternately stacked one on another. In another alternative embodiment, the sealing layer 1119 may include glass. A sealing portion for coupling the display substrate 1101 to the sealing layer 1119 may be on a plane facing the display substrate 1101 and the sealing layer 1119.

In an embodiment, since the TFT and the emission layer 230 of the display device 1100 are arranged in the horizontal direction of the display substrate 1101 as described above, the thickness of the display device 1100 may be reduced.

In an embodiment, the display device 1100 may implement top emission.

Figure 12:
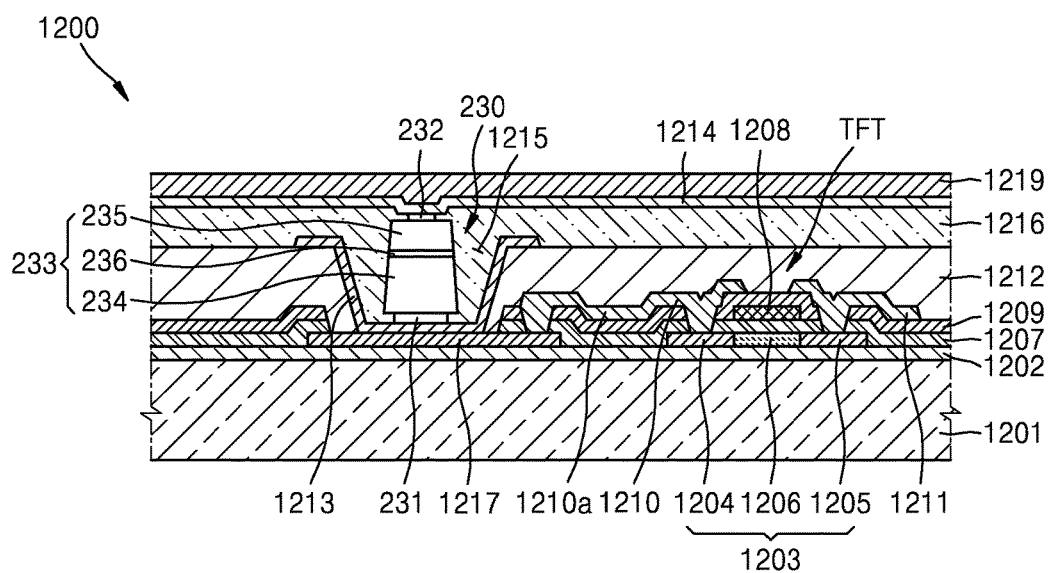

FIG. 12 is a cross-sectional view of one sub-pixel of a display device 1200 according to another alternative embodiment.

Referring to FIG. 12, an embodiment of the display device 1200 includes a display substrate 1201. A buffer layer 1202 may be on the display substrate 1201.

A TFT may be on the buffer layer 1202. The TFT includes a semiconductor active layer 1203, a gate electrode 1208, a source electrode 1210, and a drain electrode 1211.

The semiconductor active layer 1203 may be on the buffer layer 1202.

The semiconductor active layer 1203 includes a source region 1204, a drain region 1205, and a channel region 1206. A gate insulating layer 1207 may be on the semiconductor active layer 1203. The gate electrode 1208 may be on the gate insulating layer 1207.

An interlayer insulating layer 1209 may be on the gate electrode 1208. The source electrode 1210 and the drain electrode 1211 may be on the interlayer insulating layer 1209. The source electrode 1210 may be electrically connected to the source region 1204, and the drain electrode 1211 may be electrically connected to the drain region 1205.

A bank layer 1212 may be on the source electrode 1210 and the drain electrode 1211. The bank layer 1212 may cover the TFT. An opening 1215 may be defined through the bank layer 1212, e.g., formed by removing a portion of the bank layer 1212.

A conductive layer 1217 may be in the opening 1215. The conductive layer 1217 may be formed during a same process as the semiconductor active layer 1203. The conductive layer 1217 may include a same material as the semiconductor active layer 1203. In one embodiment, for example, the conductive layer 1217 includes a source region or a drain region doped with N-type impurity ions or P-type impurity ions. In an alternative embodiment, the conductive layer 1217 may be defined by a portion of the gate electrode 1208, the source electrode 1210 or the drain electrode 1211.

The conductive layer 1217 may be electrically connected to an extension portion 1210a of the source electrode 1210. The conductive layer 1217 may be electrically connected to an extension portion of one of the gate electrode 1208 and the drain electrode 1211.

The emission layer 230 may be in the opening 1215. The emission layer 230 may be adjacent to the TFT in the horizontal direction of the display substrate 1201.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 1213 may be below the emission layer 230. The first electrode 1213 may be in the opening 1215. The first electrode 1213 may be between the emission layer 230 and the conductive layer 1217. The upper surface of the first electrode 1213 may be electrically connected to the first contact electrode 231. A bottom surface of the first electrode 1213 may be electrically connected to the conductive layer 1217. The first electrode 1213 may be a reflective electrode.

An insulating layer 1216 may be on the bank layer 1212. The insulating layer 1216 may be a planarization layer. The insulating layer 1216 may cover the bank layer 1212. In an embodiment, the insulating layer 1216 may bury the emission layer 230. In an embodiment, the insulating layer 1216 may substantially entirely cover the emission layer 230 except for the first and second contact electrodes 231 and 232.

A second electrode 1214 may be over the emission layer 230. The second electrode 1214 may be on the insulating layer 1216. The second electrode 1214 may be electrically connected to the second contact electrode 232. The second electrode 1214 may be a common electrode. The second electrode 1214 may include a transparent electrode.

A sealing layer 1219 may define the outermost layer of the display substrate 1201 to protect elements over the display substrate 1201. The sealing layer 1219 includes an inorganic layer. In an alternative embodiment, the sealing layer 1219 may include at least one inorganic layer and at least one organic layer alternately stacked one on another. In another alternative embodiment, the sealing layer 1219 may include glass. A sealing portion for coupling the display substrate 1201 to the sealing layer 1219 may be on a plane facing the display substrate 1201 and the sealing layer 1219.

In an embodiment, since the TFT and the emission layer 230 of the display device 1200 are arranged in the horizontal direction of the display substrate 1201 as described above, the thickness of the display device 1200 may be reduced.

In an embodiment, since the conductive layer 1217 arranged in the same layer as a layer of the semiconductor active layer 1203 is connected to the first electrode 1213, the emission layer 230 may be arranged closer to the display substrate 1201.

In an embodiment, the display device 1200 may implement top emission.

Figure 13:
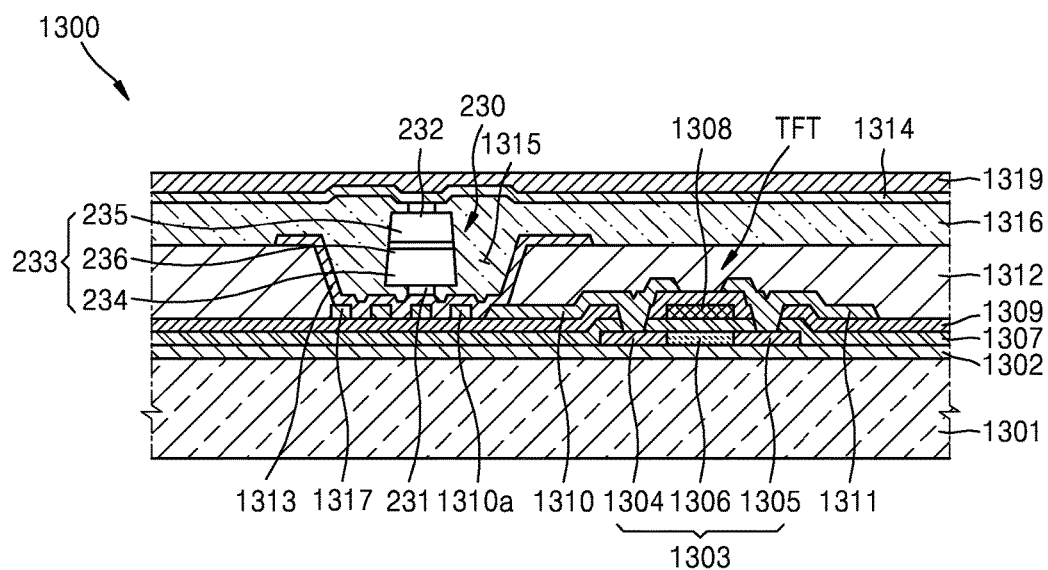

FIG. 13 is a cross-sectional view of one sub-pixel of a display device 1300 according to another alternative embodiment.

Referring to FIG. 13, an embodiment of the display device 1300 includes a display substrate 1301. A buffer layer 1302 may be on the display substrate 1301.

A TFT may be on the buffer layer 1302. The TFT includes a semiconductor active layer 1303, a gate electrode 1308, a source electrode 1310, and a drain electrode 1311.

The semiconductor active layer 1303 may be on the buffer layer 1302.

The semiconductor active layer 1303 includes a source region 1304, a drain region 1305, and a channel region 1306. A gate insulating layer 1307 may be on the semiconductor active layer 1303. The gate electrode 1308 may be on the gate insulating layer 1307.

An interlayer insulating layer 1309 may be on the gate electrode 1308. The source electrode 1310 and the drain electrode 1311 may be on the interlayer insulating layer 1309. The source electrode 1310 may be electrically connected to the source region 1304, and the drain electrode 1311 may be electrically connected to the drain region 1305.

A bank layer 1312 may be on the source electrode 1310 and the drain electrode 1311. The bank layer 1312 may cover the TFT. An opening 1315 may be defined through the bank layer 1312, e.g., formed by removing a portion of the bank layer 1312.

A conductive layer 1317 may be in the opening 1315. The conductive layer 1317 may be defined by an extension portion 1310a of the source electrode 1310. The extension portion 1310a may be connected to the source electrode 1310 as a single unitary and indivisible unit. The extension portion 1310a of the source electrode 1310 may have a zigzag shape. In an alternative embodiment, the conductive layer 1317 may defined by an extension portion of one of the semiconductor active layer 1303, the gate electrode 1308, and the drain electrode 1311 and may correspond to a portion having a zigzag shape.

The emission layer 230 may be in the opening 1315. The emission layer 230 may be adjacent to the TFT in the horizontal direction of the display substrate 1301.

The emission layer 230 includes the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 1313 may be below the emission layer 230. The first electrode 1313 may be in the opening 1315. The first electrode 1313 may be between the emission layer 230 and the conductive layer 1317. In such an embodiment, since the conductive layer 1317 has a zigzag shape, the first electrode 1313 may be formed on the conductive layer 1317 and a space between the conductive layers 1317. The first electrode 1313 may be a reflective electrode.

An insulating layer 1316 may be on the bank layer 1312. The insulating layer 1316 may be a planarization layer. The insulating layer 1316 may cover the bank layer 1312. In an embodiment, the insulating layer 1316 may bury the emission layer 230. In an embodiment, the insulating layer 1316 may substantially entirely cover the emission layer 230 except for the first and second contact electrodes 231 and 232.

A second electrode 1314 may be over the emission layer 230. The second electrode 1314 may be on the insulating layer 1316. The second electrode 1314 may be electrically connected to the second contact electrode 232. The second electrode 1314 may be a common electrode. The second electrode 1314 may include a transparent electrode.

A sealing layer 1319 may define the outermost layer of the display substrate 1301 to protect elements over the display substrate 1301. The sealing layer 1319 includes an inorganic layer. In an alternative embodiment, the sealing layer 1319 may include at least one inorganic layer and at least one organic layer alternately stacked one on another. In another alternative embodiment, the sealing layer 1319 may include glass. A sealing portion for coupling the display substrate 1301 to the sealing layer 1319 may be on a plane facing the display substrate 1301 and the sealing layer 1319.

Since the TFT and the emission layer 230 of the display device 1300 are arranged in the horizontal direction of the display substrate 1301 as described above, the thickness of the display device 1300 may be reduced.

In an embodiment, since the conductive layer 1317 has a zigzag shape, the conductive layer 1317 may diffuse light irradiated from the emission layer 230 via internal reflection.

In an embodiment, since the first electrode 1313 is connected to the conductive layer 1317 having a zigzag shape, a contact area may be widened and a contact resistance may be reduced.

In an embodiment, the display device 1300 may be of a top emission type.

Figure 14:
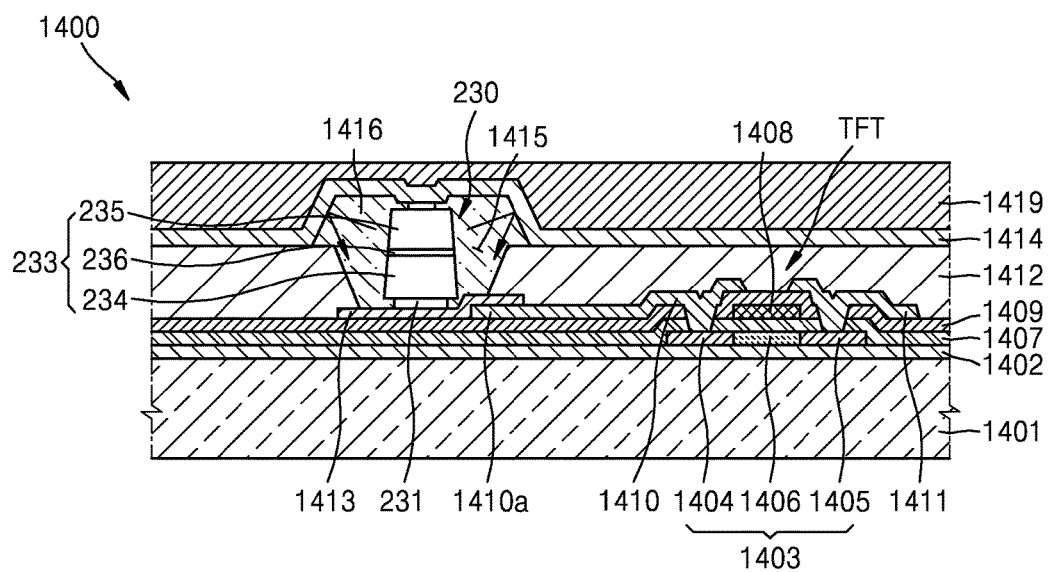

FIG. 14 is a cross-sectional view of one sub-pixel of a display device 1400 according to another alternative embodiment.

Referring to FIG. 14, an embodiment of the display device 1400 may include a display substrate 1401. A buffer layer 1402 may be on the display substrate 1301.

A TFT may be on the buffer layer 1402. The TFT may include a semiconductor active layer 1403, a gate electrode 1408, a source electrode 1410, and a drain electrode 1411.

The semiconductor active layer 1403 may be on the buffer layer 1402.

The semiconductor active layer 1403 may include a source region 1404, a drain region 1405, and a channel region 1406. A gate insulating layer 1407 may be on the semiconductor active layer 1403. The gate electrode 1408 may be on the gate insulating layer 1407.

An interlayer insulating layer 1409 may be on the gate electrode 1408. The source electrode 1410 and the drain electrode 1411 may be on the interlayer insulating layer 1409. The source electrode 1410 may be electrically connected to the source region 1404, and the drain electrode 1411 may be electrically connected to the drain region 1405.

A bank layer 1412 may be on the source electrode 1410 and the drain electrode 1411. The bank layer 1412 may cover the TFT. An opening 1415 may be defined through the bank layer 1412, e.g., formed by removing a portion of the bank layer 1412.

An edge 1410a of the source electrode 1410 may be arranged in the opening 1415. In an alternative embodiment, an edge of the drain electrode 1411 may be arranged in the opening 1415.

The emission layer 230 may be in the opening 1415. The emission layer 230 may be adjacent to the TFT in the horizontal direction of the display substrate 1401.

The emission layer 230 may include the first contact electrode 231, the second contact electrode 232, and the p-n diode 233 between the first and second contact electrodes 231 and 232. The p-n diode 233 includes the lower p-doped layer 234, the upper n-doped layer 235, and the quantum well layer 236 between the p-doped layer 234 and the n-doped layer 235.

A first electrode 1413 may be below the emission layer 230. The first electrode 1413 may be in the opening 1415. The first electrode 1413 may cover the edge 1410a of the source electrode 1410 that is exposed via the opening 1413. The first electrode 1413 may be electrically connected to the first contact electrode 231.

A second electrode 1414 may be over the emission layer 230. The second electrode 1414 may be electrically connected to the second contact electrode 232. The second electrode 1414 may be a common electrode. In an alternative embodiment, the second electrode 1414 may be patterned for each sub-pixel.

A color filter layer 1416 may be arranged around the emission layer 230. The color filter layer 1416 may bury the emission layer 230. In an embodiment, the color filter layer 1416 may substantially entirely cover the emission layer 230 except for the first and second contact electrodes 231 and 232. The color filter layer 1416 having color corresponding to the emission layer 230 may be arranged for each sub-pixel. The second electrode 1414 may be on the color filter layer 1416. The second electrode 1414 may be electrically connected to the second contact electrode 232.

In an embodiment, the first electrode 1410 of the display device 1400 may include a transparent electrode, and the second electrode 1414 includes a reflective electrode, to implement bottom emission. In an embodiment, the second electrode 1414 may include a thick film type electrode greater than the first electrode 1410 to disperse heat occurring during an operation. In one embodiment, for example, the second electrode 1414 may have a thickness of about 1000 Å.

When the emission layer 230 emits light, light irradiated above the display substrate 1401 may be reflected by the second electrode 1414. The reflected light may pass through the first electrode 1410 and be irradiated below the display substrate 1401.

A sealing layer 1419 may define the outermost layer of the display substrate 1401 to protect elements over the display substrate 1401. The sealing layer 1419 includes an inorganic layer. In an alternative embodiment, the sealing layer 1419 may include at least one inorganic layer and at least one organic layer alternately stacked one on another. In another alternative embodiment, the sealing layer 1419 may include glass. A sealing portion for coupling the display substrate 1401 to the sealing layer 1419 may be on a plane facing the display substrate 1401 and the sealing layer 1419.

In an embodiment, since the TFT and the emission layer 230 of the display device 1400 are arranged in the horizontal direction of the display substrate 1401 as described above, the thickness of the display device 1400 may be reduced.

In an embodiment, the display device 1400 may implement bottom emission.

In an embodiment, since the second electrode 1414 is a thick film type electrode, the second electrode 1414 may easily emit heat occurring during an operation.

As described above, a display device according to an embodiment may include an emission layer and a TFT in a horizontal direction of a display substrate, thereby having reduced thickness and high emission efficiency. Advantageous effects of the embodiment may be derived from the descriptions with reference to the drawings.

It should be understood that embodiments described herein should be considered in a descriptive sense only and not for purposes of limitation. Descriptions of features or aspects within each embodiment should typically be considered as available for other similar features or aspects in other embodiments.

While one or more embodiments of the invention have been described with reference to the figures, it will be understood by those of ordinary skill in the art that various changes in form and details may be made therein without departing from the spirit and scope as defined by the following claims.

What is claimed is:

1. A display device comprising:
a display substrate;
a thin film transistor over the display substrate, wherein the thin film transistor comprises a semiconductor active layer, a gate electrode, a source electrode, and a drain electrode;
a bank layer covering the thin film transistor, wherein an upper surface of the bank layer is substantially planar, an opening is defined through the bank layer, and the opening is spaced apart from the semiconductor active layer of the thin film transistor when viewed from a plan view in a vertical direction of the display substrate;
an emission layer in the opening, wherein the emission layer comprises a micro p-n diode;
a first electrode electrically connected between the thin film transistor and the emission layer;
a second electrode over the emission layer and arranged to overlap the first electrode when viewed from the plan view in the vertical direction of the display substrate;
a mirror layer over the bank layer, wherein the mirror layer is arranged to overlap the thin film transistor when viewed from the plan view in the vertical direction of the display substrate, and wherein the mirror layer comprises a reflective material; and
a sealing layer covering the second electrode,
wherein the thin film transistor and the emission layer are adjacent to each other in a horizontal direction of the display substrate.

2. The display device of claim 1, wherein
the source electrode or the drain electrode extend below the emission layer,
the first electrode is between the emission layer and an extension portion of the source electrode or the drain electrode,
the mirror layer is separated from the first electrode and is over the bank layer,
a color filter layer of a color corresponding to a sub-pixels is around the emission layer, and
the second electrode is over the color filter layer and is electrically connected to the emission layer.

3. The display device of claim 1, wherein the mirror layer is defined by a portion extending from the first electrode.

4. The display device of claim 3, wherein
the first electrode covers an edge of the source electrode or the drain electrode exposed via the opening and extends over the upper surface of the bank layer to overlap the thin film transistor,
the mirror layer is defined by an extension portion of the first electrode extending over the upper surface of the bank layer,
an insulating layer burying the emission layer extends over the bank layer,
the second electrode is over the insulating layer and is electrically connected to the emission layer, and
an opening is defined through the second electrode in a portion overlapping the mirror layer in the vertical direction of the display substrate.

5. The display device of claim 3, wherein
the first electrode covers an edge of the source electrode or the drain electrode exposed via the opening and extends over the upper surface of the bank layer to overlap the thin film transistor in the vertical direction of the display substrate, the mirror layer is defined by an extension portion of the first electrode extending over the upper surface of the bank layer, an insulating layer burying the emission layer extends over the bank layer, and the second electrode is over the insulating layer, is electrically connected to the emission layer, and has a stacked structure including the mirror layer and the insulating layer disposed between the mirror layer and the second electrode.

6. The display device of claim 5, further comprising:

a lateral reflective layer, which reflects light irradiated to a lateral surface of the emission layer and is over a lateral surface of the emission layer.

7. The display device of claim 5, wherein a portion of the source electrode or the drain electrode extends below the emission layer, an extension portion of the source electrode or the drain electrode has a ring shape, and a portion of the insulating layer around the emission layer has a trench shape.

8. The display device of claim 3, wherein the first electrode covers an edge of the source electrode or the drain electrode exposed via the opening and extends over the upper surface of the bank layer to overlap the thin film transistor in the vertical direction of the display substrate, the mirror layer is defined by an extension portion of the first electrode extending over the upper surface of the bank layer, an insulating layer burying the emission layer is over the bank layer, an opening is defined in the insulating layer in a portion overlapping the mirror layer in the vertical direction of the display substrate, the second electrode is over the insulating layer, is electrically connected to the emission layer, and exposes the mirror layer when viewed in the vertical direction of the display substrate.

9. The display device of claim 8, wherein a portion of the source electrode or the drain electrode extends below the emission layer, and an extension portion of the source electrode or the drain electrode is arranged in a zigzag pattern.

10. The display device of claim 1, wherein one of the gate electrode, the source electrode and the drain electrode of the thin film transistor extends below the emission layer, the first electrode is defined by an extension portion of the one of the gate electrode, the source electrode and the drain electrode extending below the emission layer.

11. The display device of claim 10, wherein an insulating layer burying the emission layer extends over the bank layer, the mirror layer is separated from the first electrode and is over the bank layer, the second electrode is over the insulating layer and is electrically connected to the emission layer, and the display device further comprises a lateral reflective layer, which reflects light irradiated to a lateral surface of the emission layer and is over a lateral surface of the emission layer.

12. The display device of claim 10, wherein the second electrode is over the bank layer and is electrically connected to the emission layer, the mirror layer is separated from the first electrode and is over the second electrode, and the display device further comprises a lateral reflective layer, which reflects light irradiated to a lateral surface of the emission layer and is over a lateral surface of the emission layer.

13. The display device of claim 12, wherein an extension portion of the one of the semiconductor active layer, the gate electrode, the source electrode and the drain electrode is arranged in a zigzag pattern.

14. The display device of claim 1, further comprising a conductive layer, which is below the emission layer and connected to one of the semiconductor active layer, the gate electrode, the source electrode and the drain electrode of the thin film transistor, wherein the first electrode is between the emission layer and the conductive layer, and wherein the second electrode is electrically connected to the emission layer.

15. The display device of claim 14, wherein the conductive layer is in a same layer in which the one of the semiconductor active layer, the gate electrode, the source electrode and the drain electrode is arranged, and the conductive layer is electrically connected to an extension portion of the one of the semiconductor active layer, the gate electrode, the source electrode and the drain electrode.

16. The display device of claim 14, wherein the conductive layer is defined by an extension portion of the one of the semiconductor active layer, the gate electrode, the source electrode and the drain electrode.

17. The display device of claim 16, wherein the extension portion of the one of the semiconductor active layer, the gate electrode, the source electrode and the drain electrode is arranged in a zigzag pattern.

18. A display device comprising:

a display substrate;

a thin film transistor over the display substrate, wherein the thin film transistor comprises a semiconductor active layer, a gate electrode, a source electrode, and a drain electrode;

a bank layer covering the thin film transistor, wherein an opening is defined through the bank layer;

an emission layer in the opening, wherein the emission layer comprises a micro p-n diode;

a first electrode electrically connected between the thin film transistor and the emission layer;

a second electrode over the emission layer; and a sealing layer covering the second electrode, wherein the thin film transistor and the emission layer are adjacent to each other in a horizontal direction of the display substrate, the first electrode covers an edge of the source electrode or the drain electrode which is exposed via the opening, the first electrode comprises a transparent electrode extending below the emission layer, and the second electrode is electrically connected to the emission layer and comprises a reflective electrode which reflects light in a direction to the display substrate.

* * * * *